US009477155B2

(12) United States Patent
Shibazaki

(10) Patent No.: US 9,477,155 B2
(45) Date of Patent: *Oct. 25, 2016

(54) EXPOSURE METHOD, EXPOSURE APPARATUS, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

(*) Notice: Subject to any disclaimer, the term of this patent is extended or adjusted under 35 U.S.C. 154(b) by 23 days.

This patent is subject to a terminal disclaimer.

(21) Appl. No.: 14/462,668

(22) Filed: Aug. 19, 2014

(65) Prior Publication Data

US 2014/0354971 A1    Dec. 4, 2014

Related U.S. Application Data

(60) Division of application No. 13/944,397, filed on Jul. 17, 2013, now Pat. No. 8,842,278, which is a continuation of application No. 12/860,097, filed on Aug. 20, 2010, now Pat. No. 8,514,395.

(60) Provisional application No. 61/236,704, filed on Aug. 25, 2009.

(51) Int. Cl.
*G01B 11/00* (2006.01)
*G03F 7/20* (2006.01)
(Continued)

(52) U.S. Cl.
CPC ........... *G03F 7/70133* (2013.01); *G01B 11/27* (2013.01); *G03F 7/70358* (2013.01);
(Continued)

(58) Field of Classification Search
CPC ..... G01B 11/27; G03F 9/70; G03F 7/70358; H01L 21/681
USPC .................................................. 356/399–401
See application file for complete search history.

(56) References Cited

U.S. PATENT DOCUMENTS 4,780,617 A     10/1988   Umatate et al.
5,142,156 A  *  8/1992    Ozawa ..................... G03F 9/70
                                                           250/548

(Continued)

FOREIGN PATENT DOCUMENTS

DE    10 2007 046 927 A1    4/2009
EP         1 762 897 A1     3/2007

(Continued)

OTHER PUBLICATIONS

Nov. 5, 2010 International Search Report issued in Application No. PCT/JP2010/064662.

(Continued)

*Primary Examiner* — Tarifur Chowdhury
*Assistant Examiner* — Isiaka Akanbi
(74) *Attorney, Agent, or Firm* — Oliff PLC

(57) ABSTRACT

Within area where of four heads installed on a wafer stage, heads included in the first head group and the second head group to which three heads each belong that include one head different from each other face the corresponding areas on a scale plate, the wafer stage is driven based on positional information which is obtained using the first head group, as well as obtain the displacement (displacement of position, rotation, and scaling) between the first and second reference coordinate systems corresponding to the first and second head groups using the positional information obtained using the first and second head groups. By using the results and correcting measurement results obtained using the second head group, the displacement between the first and second reference coordinate systems is calibrated, which allows the measurement errors that come with the displacement between areas on scale plates where each of the four heads face.

43 Claims, 10 Drawing Sheets

(51) Int. Cl.
  *H01L 21/68* (2006.01)
  *G03F 9/00* (2006.01)
  *G01B 11/27* (2006.01)
(52) U.S. Cl.
  CPC ....... *G03F 7/70516* (2013.01); *G03F 7/70725* (2013.01); *G03F 7/70775* (2013.01); *G03F 9/70* (2013.01); *H01L 21/681* (2013.01); *Y10T 29/49002* (2015.01)

(56) References Cited

U.S. PATENT DOCUMENTS

| | | | |
|---|---|---|---|
| 5,196,745 | A | 3/1993 | Trumper |
| 5,448,332 | A | 9/1995 | Sakakibara et al. |
| 5,610,715 | A | 3/1997 | Yoshii et al. |
| 5,646,413 | A | 7/1997 | Nishi |
| 5,969,441 | A | 10/1999 | Loopstra et al. |
| 6,208,407 | B1 | 3/2001 | Loopstra |
| 6,590,634 | B1 | 7/2003 | Nishi et al. |
| 6,611,316 | B2 | 8/2003 | Sewell |
| 6,778,257 | B2 | 8/2004 | Bleeker et al. |
| 6,819,425 | B2 | 11/2004 | Kwan |
| 7,023,610 | B2 | 4/2006 | Ohtsuki et al. |
| 7,025,498 | B2 | 4/2006 | del Puerto |
| 7,102,729 | B2 | 9/2006 | Renkens et al. |
| 7,161,659 | B2 | 1/2007 | Van Den Brink et al. |
| 7,253,875 | B1 | 8/2007 | Luttikhuis et al. |
| 7,256,871 | B2 | 8/2007 | Loopstra et al. |
| 7,289,212 | B2 | 10/2007 | Kwan |
| 7,292,312 | B2 | 11/2007 | Loopstra et al. |
| 7,333,174 | B2 | 2/2008 | Koenen et al. |
| 7,348,574 | B2 | 3/2008 | Pril et al. |
| 7,349,069 | B2 | 3/2008 | Beems et al. |
| 7,362,446 | B2 | 4/2008 | Van Der Pasch et al. |
| 7,405,811 | B2 | 7/2008 | Beems et al. |
| 7,483,120 | B2 | 1/2009 | Luttikhuis et al. |
| 7,561,280 | B2 | 7/2009 | Schluchter et al. |
| 7,602,489 | B2 | 10/2009 | Van Der Pasch et al. |
| 7,619,207 | B2 | 11/2009 | Loopstra et al. |
| 7,636,165 | B2 | 12/2009 | Klaver et al. |
| 7,710,540 | B2 | 5/2010 | Loopstra et al. |
| 2002/0171821 | A1* | 11/2002 | Cloud ............... G01C 25/00 356/4.01 |
| 2003/0025890 | A1 | 2/2003 | Nishinaga |
| 2005/0128461 | A1 | 6/2005 | Beems et al. |
| 2005/0259234 | A1 | 11/2005 | Hirukawa et al. |
| 2006/0139660 | A1 | 6/2006 | Kwan |
| 2006/0227309 | A1 | 10/2006 | Loopstra et al. |
| 2007/0052976 | A1 | 3/2007 | Pril et al. |
| 2007/0076218 | A1 | 4/2007 | Van Empel et al. |
| 2007/0127006 | A1 | 6/2007 | Shibazaki |
| 2007/0195296 | A1 | 8/2007 | Van Der Pasch et al. |
| 2007/0211235 | A1 | 9/2007 | Shibazaki |
| 2007/0263197 | A1 | 11/2007 | Luttikhuis et al. |
| 2007/0288121 | A1* | 12/2007 | Shibazaki ........... G03F 7/70516 700/213 |
| 2008/0068568 | A1 | 3/2008 | Ebihara et al. |
| 2008/0074681 | A1 | 3/2008 | Loopstra et al. |
| 2008/0088843 | A1 | 4/2008 | Shibazaki |
| 2008/0094592 | A1 | 4/2008 | Shibazaki |
| 2008/0094593 | A1 | 4/2008 | Shibazaki |
| 2008/0240501 | A1 | 10/2008 | Van Der Wijst et al. |
| 2009/0153817 | A1 | 6/2009 | Kawakubo |
| 2009/0323037 | A1 | 12/2009 | Aarts et al. |
| 2010/0235127 | A1 | 9/2010 | Kwan |

FOREIGN PATENT DOCUMENTS

| | | |
|---|---|---|
| EP | 1 826 615 A2 | 8/2007 |
| WO | WO 99/49504 | 9/1999 |
| WO | WO 01/35168 A1 | 5/2001 |

OTHER PUBLICATIONS

Nov. 5, 2010 Written Opinion of the International Searching Authority issued in Application No. PCT/JP2010/064662.
Oct. 4, 2012 Office Action issued in U.S. Appl. No. 12/860,097.
Jan. 4, 2013 Office Action issued in European Patent Application No. 10752443.1.
Apr. 22, 2013 Notice of Allowance issued in U.S. Appl. No. 12/860,097.
Sep. 11, 2013 Office Action issued in U.S. Appl. No. 13/944,397.
Jan. 28, 2014 Office Action issued in U.S. Appl. No. 13/944,397.
Feb. 12, 2015 Office Action issued in European Application No. 14179101.2.
Nov. 24, 2015 Search Report issued in European Patent Application No. 15173365.6.
Dec. 15, 2015 Office Action issued in European Patent Application No. 15173365.6.

* cited by examiner

EXPOSURE METHOD, EXPOSURE APPARATUS, AND DEVICE MANUFACTURING METHOD

CROSS-REFERENCE TO RELATED APPLICATIONS

This non-provisional application is a divisional application of Non-Provisional application Ser. No. 13/944,397 (now U.S. Pat. No. 8,842,278), filed Jul. 17, 2013, which is a continuation application of Non-Provisional application Ser. No. 12/860,097 (now U.S. Pat. No. 8,514,395) filed Aug. 20, 2010, which claims the benefit of Provisional Application No. 61/236,704 filed Aug. 25, 2009, the disclosure of which is hereby incorporated herein by reference in its entirety.

BACKGROUND OF THE INVENTION

1. Field of the Invention

The present invention relates to exposure methods, exposure apparatuses, and device manufacturing methods, and more particularly to an exposure method and an exposure apparatus used in a lithography process to manufacture microdevices (electronic devices) such as a semiconductor device, and a device manufacturing method using the exposure method or the exposure apparatus.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper), or a projection exposure apparatus by a step-and-scan method (a so-called scanning stepper (which is also called a scanner) is mainly used.

In these types of exposure apparatuses, with finer device patterns due to higher integration of semiconductor devices, requirements for high overlay accuracy (alignment accuracy) is increasing. Therefore, requirements for higher accuracy is increasing, also in position measurement of substrates such as a wafer and the like on which a pattern is formed.

As an apparatus to meet such requirements, for example, in U.S. Patent Application Publication No. 2006/0227309, an exposure apparatus is proposed which is equipped with a position measurement system using a plurality of encoder type sensors (encoder heads) installed on a substrate table. In this exposure apparatus, the encoder head irradiates a measurement beam on a scale which is placed facing a substrate table, and measures the position of the substrate table by receiving a return beam from the scale. In the position measurement system disclosed in U.S. Patent Application Publication No. 2006/0227309 and the like, it is desirable for the scale to cover as much movement area of the substrate table as possible, except for the area right under the projection optical system. Therefore, a scale with a large area becomes necessary; however, to make a highly precise scale having a large area is very difficult, as well as costly. Accordingly, a plurality of small-area scales are usually made which is the scale divided into a plurality of sections, and then the small-scales are combined. Accordingly, while it is desirable for the alignment performed on the plurality of scales to be accurate, it is difficult in reality to make a scale with no individual difference, and to put the scales together without any errors.

SUMMARY OF THE INVENTION

The present invention was made under the circumstances described above, according to a first aspect, there is provided a first exposure method in which an object is exposed, the method comprising: obtaining correction information in a first movement area of a movable body where of a plurality of heads provided on the movable body which moves along a predetermined plane, a plurality of head groups to which a plurality of heads including at least one head different from each other belong faces a measurement plane placed roughly parallel to the predetermined plane outside of the movable body, the correction information being information of a displacement between a plurality of different reference coordinate systems corresponding to each of the plurality of head groups; and exposing an object held by the movable body by obtaining positional information of the movable body using a plurality of heads belonging to the plurality of head groups, and driving the movable body using the positional information and the correction information of the displacement between the plurality of different reference coordinate systems corresponding to the plurality of head groups within the first movement area.

According to this method, it becomes possible to drive the movable body with good precision within the first movement area using the positional information of the movable body obtained using a plurality of heads corresponding to each of a plurality of head groups, without being affected by displacement between a plurality of different reference coordinate system corresponding to each of the plurality of head groups, which makes exposure with high precision possible to the object held by the movable body.

According to a second aspect of the present invention, there is provided a second exposure method in which an object is exposed, the method comprising: driving a movable body within a predetermined area where of a first number of heads installed on the movable body holding the object, a second number of heads belonging to a first head group and a second head group including at least one head different from each other face a corresponding area on a measurement plane, based on at least one of a first and second positional information which is obtained using the first and second head groups to expose the object.

According to this method, it becomes possible to drive the movable body with high precision even if the coordinate systems corresponding to the first head group and the second head group differ, without being affected.

According to a third aspect of the present invention, there is provided a first exposure apparatus which exposes an object, the apparatus comprising: a movable body which holds an object and moves along a predetermined plane; a position measurement system which obtains positional information of the movable body based on an output of a head which irradiates a measurement beam on a measurement plane placed roughly parallel to the predetermined plane external to the movable body in the vicinity of an exposure position to the object, and receives a return beam from the measurement plane, of a plurality of heads provided on the movable body; and a control system which drives the movable body based on the positional information obtained by the position measurement system, and switches a head which the position measurement system uses to obtain the positional information out of the plurality of heads according to the position of the movable body, wherein the control system corrects a displacement between a plurality of reference coordinate systems reciprocally corresponding to the plurality of heads, within a first movement area of the movable body where the plurality of heads face the measurement plane.

According to this apparatus, because reciprocal displacement of the plurality of reference coordinate systems is corrected, it becomes possible to measure the positional information of the movable body and drive (control the position of) the movable body with high precision using the plurality of heads.

According to a fourth aspect of the present invention, there is provided a second exposure apparatus which exposes an object, the apparatus comprising: a movable body which holds the object and moves along a predetermined plane; a position measurement system which obtains positional information of the movable body based on an output of a head which irradiates a measurement beam on a measurement plane placed roughly parallel to the predetermined plane external to the movable body in the vicinity of an exposure position to the object, and receives a return beam from the measurement plane, of a first number of heads installed on the movable body; a drive system which drives the movable body; and a control system which controls the drive system within a predetermined area where of a first number of heads of the position measurement system, a second number of heads belonging to a first head group and a second head group including at least one head different from each other face a corresponding area on a measurement plane, based on at least one of a first and second positional information which is obtained using the first and second head groups.

According to this apparatus, it becomes possible to drive the movable body with high precision even if the coordinate systems corresponding to the first head group and the second head group differ, without being affected.

According to a fifth aspect of the present invention, there is provided a third exposure apparatus which exposes an object, the apparatus comprising: a movable body which holds the object and moves along a predetermined plane; a position measurement system which obtains positional information of the movable body based on an output of a head which irradiates a measurement beam on a measurement plane placed roughly parallel to the predetermined plane external to the movable body in the vicinity of an exposure position to the object, and receives a return beam from the measurement plane, of a plurality of heads provided on the movable body; and a control system which drives the movable body based on the positional information obtained by the position measurement system, as well as obtains a correction information of the positional information of the movable body obtained by the position measurement system by moving the movable body within an area where position measurement can be performed using a second number of heads which is more than a first number of heads which are used in position control of the movable body.

According to this apparatus, because correction information of the positional information of the movable body obtained by the position measurement system is obtained by the control system, it becomes possible to drive the movable body with high precision, using the correction information.

According to a sixth aspect of the present invention, there is provided a third exposure method in which an object is exposed, the method comprising: obtaining a correction information of a positional information of the movable body obtained by a position measurement system by moving the movable body within a first movement area of the movable body in which of a plurality of heads provided on a movable body which moves along a predetermined plane, a plurality of group heads to which a first number of heads that are required to control the position of the movable body including at least head one different with each other belong, faces a measurement plane place roughly in parallel to the predetermined plane outside of the movable body; and exposing the object holding the movable body by driving the movable body using the correction information.

According to this method, exposure to the object with high precision becomes possible.

According to a seventh aspect of the present invention, there is provided a fourth exposure apparatus which exposes an object, the apparatus comprising: a movable body which holds the object and moves along a predetermined plane; a position measurement system which obtains positional information of the movable body based on an output of a head which irradiates a measurement beam on a measurement plane made up of a plurality of scale plates that is placed roughly parallel to the predetermined plane external to the movable body in the vicinity of an exposure position to the object, and receives a return beam from the measurement plane, of a plurality of heads provided on the movable body; and a control system which drives the movable body based on the positional information obtained by the position measurement system, and switches a head which the position measurement system uses to obtain the positional information out of the plurality of heads according to the position of the movable body, wherein the control system obtains a positional relation between a plurality of scale plates reciprocally corresponding to the plurality of heads, within a first movement area of the movable body where the plurality of heads face the measurement plane.

According to the apparatus, because the positional relation between the plurality of scale plates reciprocally is obtained by the control system, it becomes possible to measure the positional information of the movable body using the plurality of heads and also drive (control the position of) the movable body with high precision.

According to an eighth aspect of the present invention, there is provided a fourth exposure method in which an object is exposed, the method comprising: obtaining a positional relation in a first movement area of a movable body where of a plurality of heads provided on the movable body which moves along a predetermined plane, a plurality of head groups to which a plurality of heads including at least one head different from each other belong faces a measurement plane made up of the plurality of scale plates placed roughly in parallel with the predetermined plane outside of the movable body, the positional relation being a relation between the plurality of scale plates reciprocally corresponding to each of a plurality of head groups; and exposing an object held by the movable body by obtaining positional information of the movable body using a plurality of heads corresponding to the plurality of head groups, and driving the movable body using the positional information and the positional relation between the plurality of scale plates reciprocally corresponding to each of the plurality of head groups within the first movement area.

According to this method, it becomes possible to drive the movable body with good precision within the first movement area using the positional information of the movable body obtained using a plurality of heads corresponding to each of a plurality of head groups, without being affected by a positional displacement between a plurality of scale plates corresponding to each of the plurality of head groups, which makes exposure with high precision possible to the object held by the movable body.

According to a ninth aspect of the present invention, there is provided a device manufacturing method, including exposing an object using any one of the first to fourth exposure apparatuses of the present invention, and forming a pattern on the object; and developing the object on which the pattern is formed.

According to a tenth aspect of the present invention, there is provided a device manufacturing method, including exposing an object using any one of the first to fourth exposure methods of the present invention, and forming a pattern on the object; and developing the object on which the pattern is formed.

BRIEF DESCRIPTION OF THE DRAWINGS

In the accompanying drawings.

DESCRIPTION OF THE EMBODIMENTS

An embodiment of the present invention will be described below, with reference to FIGS. 1 to 10B.

Figure 1:
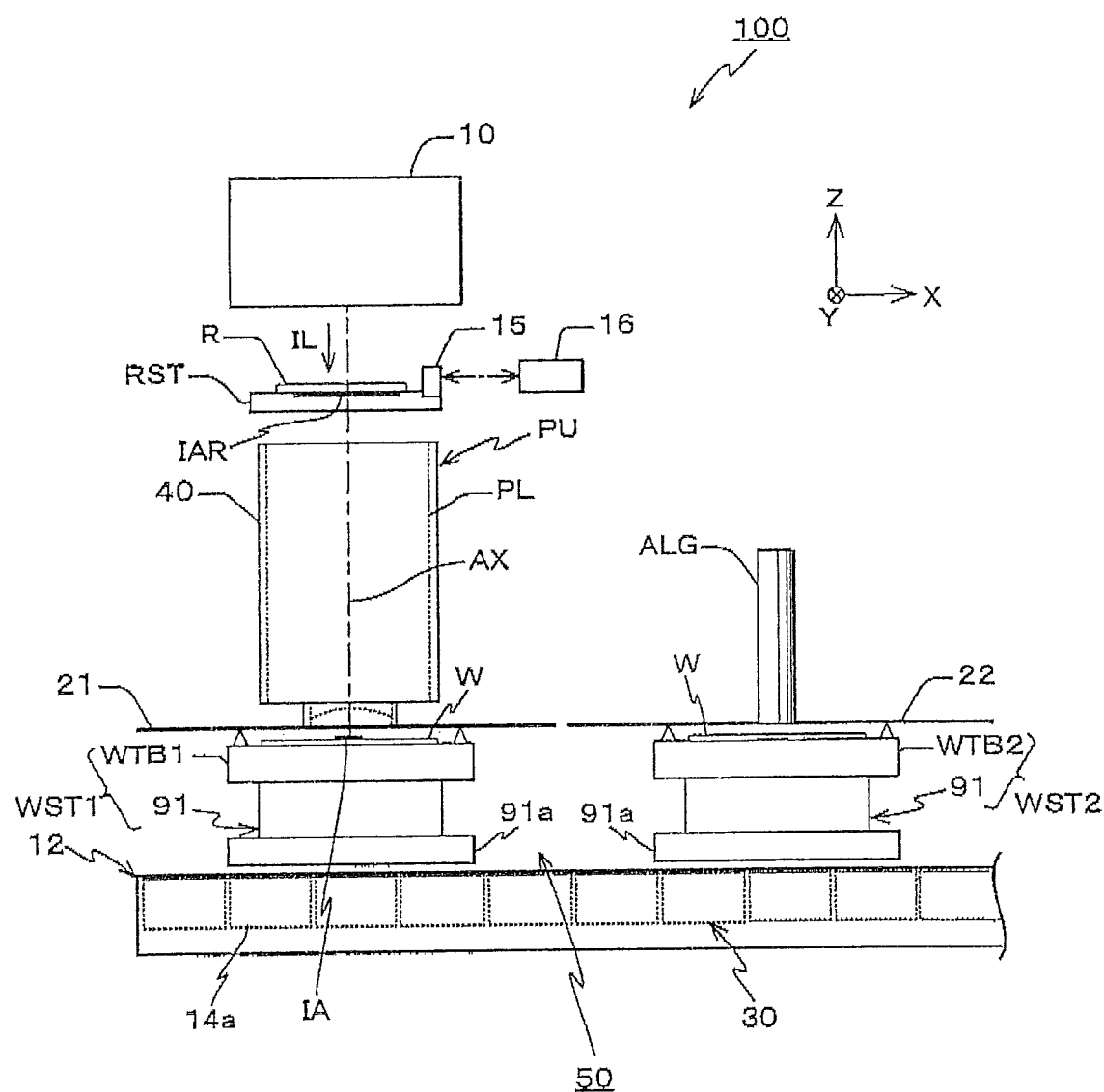
FIG. 1 is a view schematically showing the configuration of an exposure apparatus related to an embodiment.

FIG. 1 schematically shows the configuration of an exposure apparatus 100 related to the present embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θ x, θ y, and θ z directions, respectively.

Exposure apparatus 100 is equipped with an illumination system 10, a reticle stage RST holding reticle R, a projection unit PU, a wafer stage device 50 including wafer stages WST1 and WST2 on which a wafer W is mounted, a control system for these parts and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system), by an illumination light (exposure light) IL with a substantially uniform illuminance. Here, as one example, ArF excimer laser light (with a wavelength of 193 nm) is used as the illumination light IL.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a predetermined scanning speed.

The positional information (including position information in the θz direction (θz rotation quantity)) of reticle stage RST in the XY plane (movement plane) is constantly detected, for example, at a resolution of around 0.25 nm by a reticle laser interferometer (hereinafter referred to as a "reticle interferometer") 16, which irradiates a measurement beam on a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) shown in FIG. 1. Incidentally, to measure the positional information of reticle R at least in directions of three degrees of freedom, instead of, or together with reticle interferometer 16, the encoder system which is disclosed in, for example, U.S. Patent Application Publication No. 2007/0288121 and the like can be used.

Projection unit PU is placed below (−Z side) reticle stage RST in FIG. 1, and is held by a main frame (not shown) (metrology frame) which configures a part of a body. Projection unit PU has a barrel 40, and a projection optical system PL consisting of a plurality of optical elements held by barrel 40. As projection optical system PL, for example, a dioptric system is used, consisting of a plurality of lenses (lens elements) that has been disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL, in an area (exposure area) IA conjugate to illumination area IAR on wafer W whose surface is coated with a resist (a sensitive agent) and is placed on a second plane (an image plane) side of projection optical system PL. And by reticle stage RST and wafer stages WST1 and WST2 being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W.

Incidentally, the main frame can be one of a gate type frame which is conventionally used, and a hanging support type frame disclosed in, for example, U.S. Patent Application Publication No. 2008/0068568 and the like.

Figure 2:
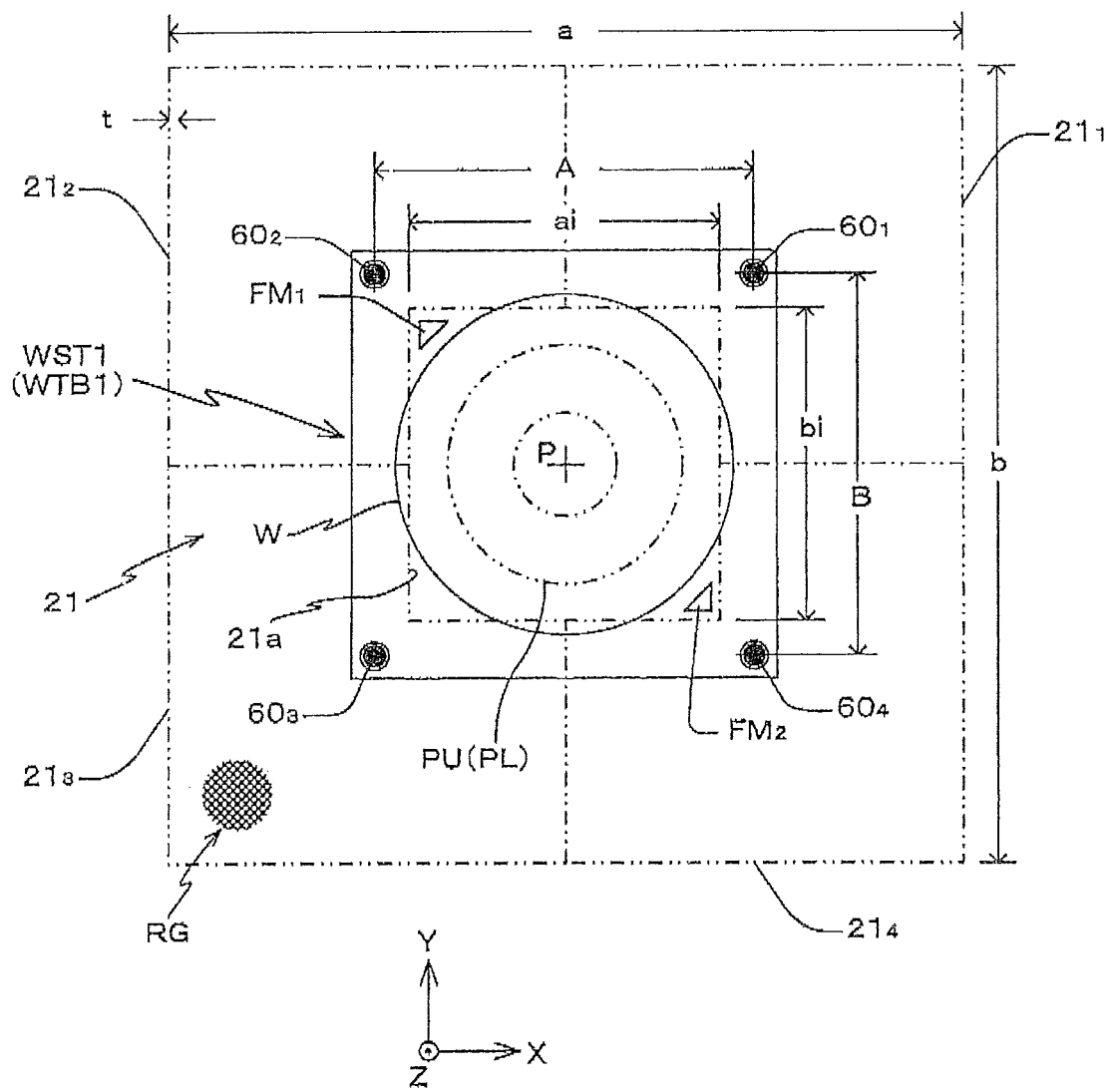
FIG. 2 is a view showing a configuration of an encoder system placed in the periphery of a projection optical system.

In the periphery on the −Z side end of barrel 40, for example, a scale plate 21 is placed parallel to the XY plane, at a height substantially flush with a surface on the lower end of barrel 40. As shown in FIG. 2 in the embodiment, scale plate 21 is configured, for example, of four L-shaped sections (parts) $21_1$, $21_2$, $21_3$, and $21_4$, and the −Z end of barrel 40 is inserted, for example, inside a rectangular shaped opening 21a formed in the center. In this case, the width in the X-axis direction and the Y-axis direction of scale plate 21 is a and b, respectively, and the width of opening 21a in the X-axis direction and the Y-axis direction is $a_i$ and $b_i$, respectively.

Figure 3:
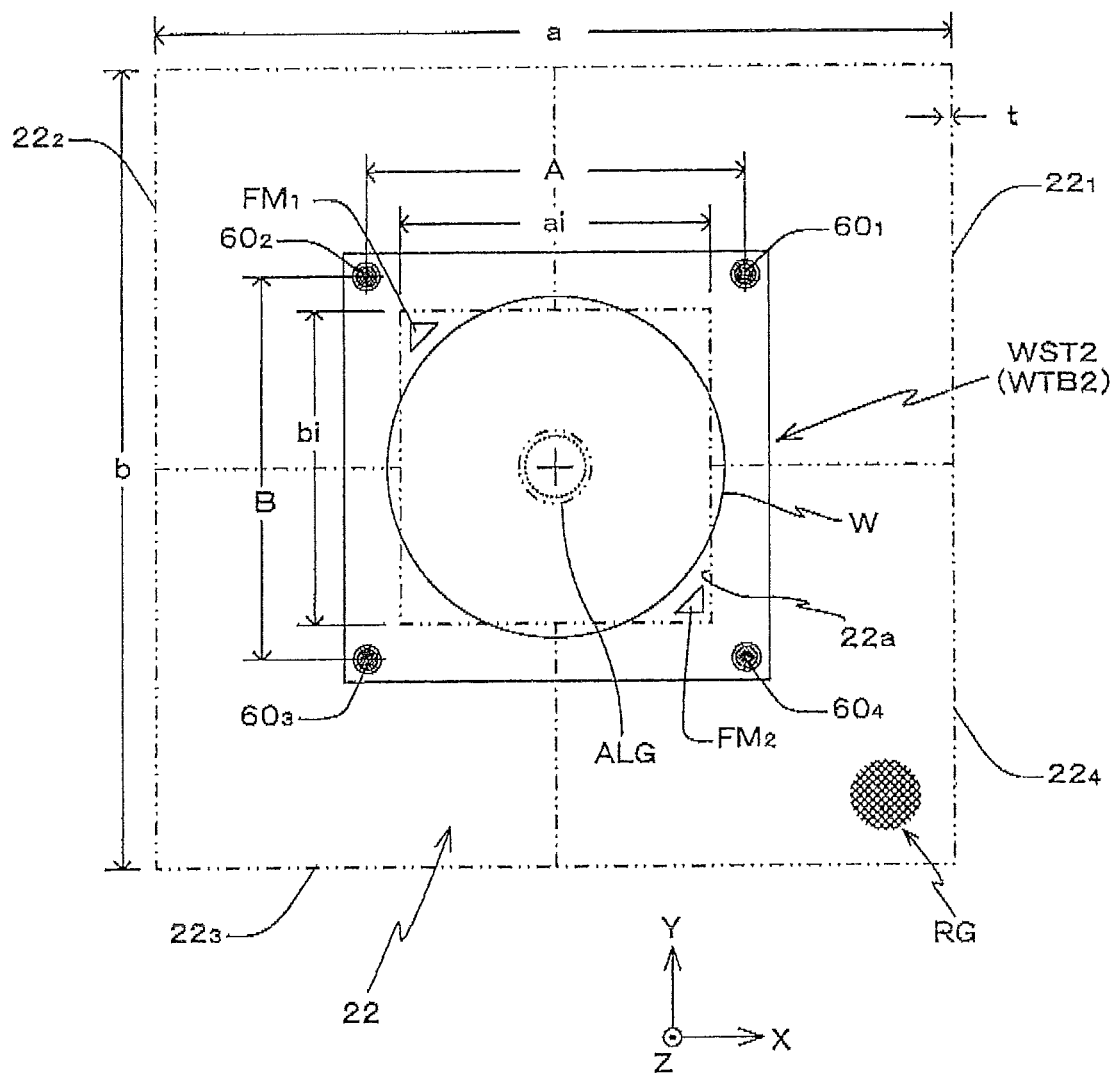
FIG. 3 is a view showing a configuration of an encoder system placed in the periphery of an alignment system.

At a position away from scale plate 21 in the +X direction is a scale plate 22, which is placed substantially flush with scale plate 21, as shown in FIG. 1. Scale plate 22 is also configured, for example, of four L-shaped sections (parts) $22_1$, $22_2$, $22_3$, and $22_4$ as is shown in FIG. 3, and the −Z end of an alignment system ALG which will be described later is inserted, for example, inside a rectangular shaped opening 22a formed in the center. The width in the X-axis direction and the Y-axis direction of scale plate 22 is a and b, respectively, and the width of opening 22a in the X-axis direction and the Y-axis direction is $a_i$ and $b_i$, respectively. Incidentally, in the embodiment, while the width of scale plates 21 and 22, and the width of openings 21a and 22a in the X-axis and the Y-axis directions were the same, the width does not necessarily have to be the same, and the width may differ in at least one of the X-axis and the Y-axis directions.

In the embodiment, scale plates 21 and 22 are supported by suspension from a main frame (not shown) (metrology frame) which supports projection unit PU and alignment system ALG. On the lower surface (a surface on the −Z side) of scale plates 21 and 22, a reflection type two-dimensional diffraction grating RG (refer to FIGS. 2, 3, and 4) is formed, consisting of a grating of a predetermined pitch, such as, for example, a grating of 1 μm whose periodic direction is in a direction of 45 degrees with the X-axis serving as a reference (a direction of −45 degrees when the Y-axis serves as a reference), and a grating of a predetermined pitch, such as, for example, a grating of 1 μm, whose periodic direction is in a direction of −45 degrees with the X-axis serving as a reference (−135 degrees when the Y-axis serves as a reference). However, due to the configuration of the two-dimensional grating RG and an encoder head which will be described later on, a non-effective area having a width t is included in each of the vicinity of the outer periphery of sections $21_1$ to $21_4$ and $22_1$ to $22_4$ configuring scale plates 21 and 22. The two-dimensional grating RG of scale plates 21 and 22 covers a movement range of wafer stages WST1 and WST2, respectively, at least at the time of exposure operation and alignment (measurement).

Wafer stage device 50, as shown in FIG. 1, is equipped with a stage base 12 supported almost horizontally by a plurality of (for example, three or four) vibration isolation mechanisms (omitted in the drawings) on the floor surface, wafer stages WST1 and WST2 placed on stage base 12, a wafer stage drive system 27 (only a part of the system shown in FIG. 1, refer to FIG. 6) which drives wafer stages WST1 and WST2, and a measurement system which measures the position of wafer stages WST1 and WST2 and the like. The measurement system is equipped with encoder systems 70 and 71, and a wafer laser interferometer system (hereinafter simply described as a wafer interferometer system) 18 and the like shown in FIG. 6. Incidentally, encoder systems 70 and 71, and wafer interferometer system 18 will be further described later in the description. However, in the embodiment, wafer interferometer system 18 does not necessarily have to be provided.

As shown in FIG. 1, stage base 12 is made of a member having a tabular form, and the degree of flatness of the upper surface is extremely high and serves as a guide surface when wafer stages WST1 and WST2 move. Inside stage base 12, a coil unit is housed, including a plurality of coils 14a placed in the shape of a matrix with the XY two-dimensional direction serving as a row direction and a column direction.

Incidentally, another base member to support the base by levitation can be provided separately from base 12, and stage base 12 can be made to function as a counter mass (reaction force canceller) which moves according to the law of conservation of momentum by the reaction force of the drive force of wafer stages WST1 and WST2.

As shown in FIG. 1, wafer stage WST1 has a stage main section 91, and a wafer table WTB1 which is placed above stage main section 91 and is supported in a non-contact manner with respect to stage main section 91 by a Z tilt drive mechanism (not shown). In this case, wafer table WTB1 is supported in a non-contact manner by Z tilt drive mechanism by adjusting the balance of the upward force (repulsion) such as the electromagnetic force and the downward force (gravitation) including the self-weight at three points, and is also finely driven at least in directions of three degrees of freedom, which are the Z-axis direction, the θx direction, and the θy direction. At the bottom of stage main section 91, a slider section 91a is arranged. Slider section 91a has a magnetic unit made up of a plurality of magnets arranged two-dimensionally within the XY plane, a housing to house the magnetic unit, and a plurality of air bearings arranged in the periphery of the bottom surface of the housing. The magnet unit configures a planar motor 30 which uses the drive of an electromagnetic force (the Lorentz force) as disclosed in, for example, U.S. Pat. No. 5,196,745, along with the coil unit previously described. Incidentally, as planar motor 30, the drive method is not limited the Lorentz force drive method, and a planar motor by a variable reluctance drive system can also be used.

Wafer stage WST1 is supported by levitation above stage base 12 by a predetermined clearance (clearance gap/distance/gap/spatial distance), such as around several μm, by the plurality of air bearings described above, and is driven in the X-axis direction, the Y-axis direction, and the θz direction by planar motor 30. Accordingly, wafer table WTB1 (wafer W) is drivable with respect to stage base 12 in directions of six degrees of freedom (hereinafter shortly described as the X-axis direction, the Y-axis direction, the Z-axis direction, the θx direction, the θy direction, and the θz direction (hereinafter shortly referred to as X, Y, Z, θx, θy, θz)).

In the embodiment, a main controller 20 controls the magnitude and direction of current supplied each of the coils 14a configuring the coil unit. Wafer stage drive system 27 is configured, including planar motor 30 and the Z tilt drive mechanism previously described. Incidentally, planar motor 30 is not limited to a motor using a moving magnet method, and can be a motor using a moving coil method. Further, as planar motor 30, a magnetic levitation type planar motor can be used. In this case, the air bearing previously described does not have to be arranged. Further, wafer stage WST can be driven in directions of six degrees of freedom by planar motor 30. Further, wafer table WTB1 can be made finely movable in at least one of the X-axis direction, the Y-axis direction, and the θZ direction. More specifically, wafer stage WST1 can be configured by a rough/fine movement stage.

On wafer table WTB1, wafer W is mounted via a wafer holder (not shown), and is fixed by a chuck mechanism (not shown), such as, for example, vacuum suction (or electrostatic adsorption). Further, on one of the diagonal lines on wafer table WTB1, a first fiducial mark plate FM1 and a second fiducial mark plate FM2 are provided, with the wafer holder in between (for example, refer to FIG. 2). On the upper surface of the first fiducial mark plate FM1 and the second fiducial mark plate FM2, a plurality of reference marks which are detected by a pair of reticle alignment systems 13A and 13B and alignment system ALG are formed, respectively. Incidentally, the positional relation between the plurality of reference marks on the first and second fiducial plates FM1 and FM2 are to be known.

Wafer stage WST2 is also configured in a similar manner as wafer stage WST1.

Encoder systems 70 and 71 obtain (measure) positional information of wafer stages WST1 and WST2, respectively, in directions of six degrees of freedom (X, Y, Z, θ x, θ y, θ z) in an exposure time movement area (in an area where the wafer stage moves when exposing a plurality of shot areas on wafer W) including an area right below projection optical system PL, and in an measurement time movement area including an area right below alignment system ALG. Now, a configuration and the like of encoder systems 70 and 71 will be described in detail. Incidentally, exposure time movement area (a first movement area) is an area in which the wafer stage moves during an exposure operation within the exposure station (a first area) where the exposure of the wafer is performed via projection optical system PL, and the exposure operation, for example, includes not only exposure of all of the shot areas on the wafer to which the pattern should be transferred, but also the preparatory operations (for example, detection of the fiducial marks previously described) for exposure. Measurement time movement area (a second movement area) is an area in which the wafer stage moves during a measurement operation within the measurement station (a second area) where the measurement of the positional information is performed by detection of alignment marks on the wafer by alignment system ALG, and the measurement operation, for example, includes not only detection of a plurality of alignment marks on the wafer, but also detection (furthermore, measurement of positional information (step information) of the wafer in the Z-axis direction) of fiducial marks by alignment system ALG.

Figure 4:
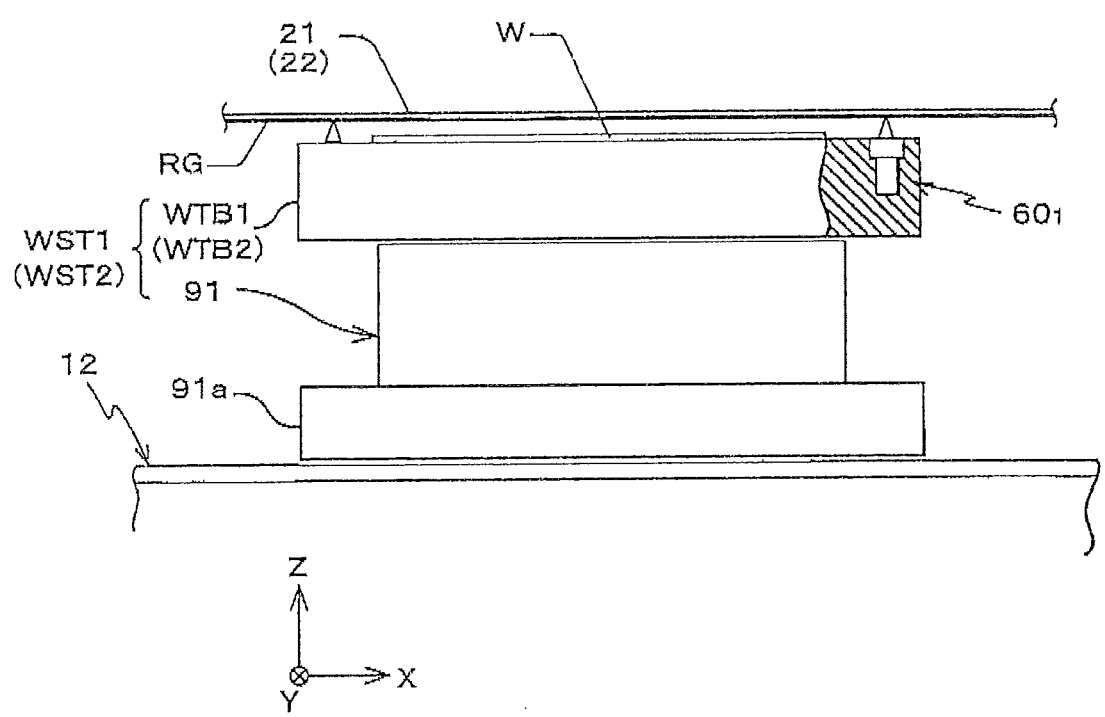
FIG. 4 is an enlarged view of a wafer stage partially fractured.

In wafer tables WTB1 and WTB2, as shown in an planar view in FIGS. 2 and 3, respectively, encoder heads (hereinafter appropriately referred to as a head) $60_1$ to $60_4$ are placed in each of the four corners on the upper surface. In this case, the separation distance in the X-axis direction between heads $60_1$ and $60_2$ and the separation distance in the X-axis direction between heads $60_3$ and $60_4$ are both equal to A. Further, the separation distance in the Y-axis direction between heads $60_1$ and $60_4$ and the separation distance in the Y-axis direction between heads $60_2$ and $60_3$ are both equal to B. These separation distances A and B are larger than width $a_i$ and $b_i$ of opening 21a of scale plate 21. Specifically, taking into consideration width t of the non-effective area previously described, $A \geq a_i+2t$, $B \geq b_i+2t$. Heads $60_1$ to $60_4$ are housed, respectively, inside holes of a predetermined depth in the Z-axis direction which have been formed in wafer tables WTB1 and WTB2 as shown in FIG. 4, with head $60_1$ taken up as a representative.

Figure 5:
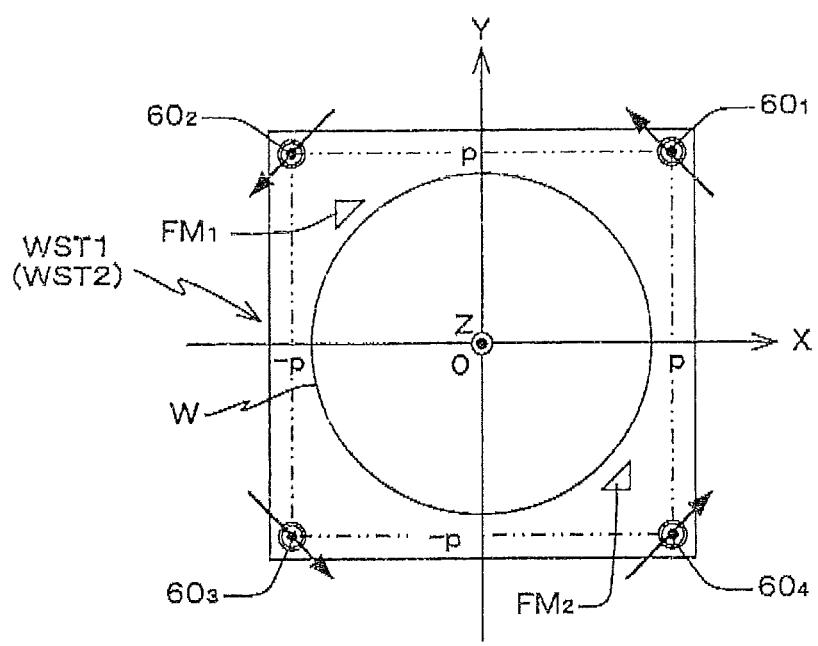
FIG. 5 is a view showing a placement of encoder heads on the wafer stage.

As shown in FIG. 5, head $60_1$ is a two-dimensional head in a −135 degrees direction with the X-axis serving as a reference (in other words, a −45 degrees direction with the X-axis serving as a reference) and whose measurement direction is in the Z-axis direction. Similarly, heads $60_2$ to $60_4$ are two-dimensional heads that are in a 225 degrees direction with the X-axis serving as a reference (in other words, a 45 degrees direction with the X-axis serving as a reference) whose measurement direction is in the Z-axis direction, a 315 degrees direction with the X-axis serving as a reference (in other words, a −45 degrees direction with the X-axis serving as a reference) whose measurement direction is in the Z-axis direction, and a 45 degrees direction with the X-axis serving as a reference whose measurement direction is in the Z-axis direction, respectively. As is obvious from FIGS. 2 and 4, heads $60_1$ to $60_4$ irradiate a measurement beam on the two dimensional diffraction grating RG formed on the surface of sections $21_1$ to $21_4$ of scale plate 21 or sections $22_1$ to $22_4$ of scale plate 22 that face the heads, respectively, and by receiving the reflected/diffraction beams from two-dimensional grating RG, measure the position of wafer table WTB1 and WTB2 (wafer stages WST1 and WST2) for each of the measurement directions. Now, as each of the heads $60_1$ to $60_4$, a sensor head having a configuration similar to a sensor head for measuring variation as is disclosed in, for example, U.S. Pat. No. 7,561,280, can be used.

In heads $60_1$ to $60_4$ configured in the manner described above, since the optical path lengths of the measurement beams in air are extremely short, the influence of air fluctuation can mostly be ignored. However, in the embodiment, the light source and a photodetector are arranged external to each head, or more specifically, inside (or outside) stage main section 91, and only the optical system is arranged inside of each head. And the light source, the photodetector, and the optical system are optically connected via an optical fiber (not shown). In order to improve the positioning precision of wafer table WTB (fine movement stage), air transmission of a laser beam and the like can be performed between stage main section 91 (rough movement stage) and wafer table WTB (fine movement stage) (hereinafter shortly referred to as a rough/fine movement stage), or a configuration can be employed where a head is provided in stage main section 91 (rough movement stage) so as to measure a position of stage main section 91 (rough movement stage) using the head and to measure relative displacement of the rough/fine movement stage with another sensor.

When wafer stages WST1 and WST2 are located within the exposure time movement area previously described, head $60_1$ configures two-dimensional encoders $70_1$ and $71_1$ (refer to FIG. 6) which irradiate a measurement beam (measurement light) on (section $21_1$ of) scale plate 21, receive the diffraction beam from the grating whose periodical direction is in a 135 degrees direction with the X-axis serving as a reference, or in other words, in a −45 degrees direction (hereinafter simply referred to as a −45 degrees direction) with the X-axis serving as a reference, formed on the surface (lower surface) of scale plate 21, and measure the position of wafer tables WTB1 and WTB2 in the −45 degrees direction and in the Z-axis direction. Similarly, heads $60_2$ to $60_4$ each configure two-dimensional encoders $70_2$ to $70_4$ and $71_2$ to $71_4$ (refer to FIG. 6) which irradiate a measurement beam (measurement light) on (sections $21_2$ to $21_4$ of) scale plate 21, respectively, receive a diffraction beam from the grating whose periodical direction is in a 225 degrees direction, or in other words, in a +45 degrees direction (hereinafter simply referred to as a 45 degrees direction), a 315 degrees direction, or in other words, whose periodical direction is in a −45 degrees direction with the X-axis serving as a reference, and a 45 degrees direction with the X-axis serving as a reference, formed on the surface (lower surface) of scale plate 21, and measure the position in the 225 degrees (45 degrees) direction and in the Z-axis direction, the position in the 315 degrees (−45 degrees) direction and the Z-axis direction, and the position in the 45 degrees direction and the Z-axis direction of wafer tables WTB1 and WTB2.

Further, when wafer stage WST1 and WST2 are located within the measurement time movement area previously described, head $60_1$ configures two-dimensional encoders $70_1$ and $71_1$ (refer to FIG. 6) which irradiate a measurement beam (measurement light) on (section $22_1$ of) scale plate 22, receive the diffraction beam from the grating whose periodical direction is in a 135 degrees direction (−45 degrees direction) with the X-axis serving as a reference formed on the surface (lower surface) of scale plate 22, and measure the position of wafer tables WTB1 and WTB2 in the −45 degrees direction and in the Z-axis direction. Similarly, heads $60_2$ to $60_4$ configure two-dimensional encoders $70_2$ to $70_4$ and $71_2$ to $71_4$ (refer to FIG. 6) which irradiate a measurement beam (measurement light) on (sections $22_2$ to $22_4$ of) scale plate 22, respectively, receive a diffraction beam from the grating whose periodical direction is in a 225 degrees direction (45 degrees direction), a 315 degrees direction (−45 degrees direction), and a 45 degrees direction with the X-axis serving as a reference, formed on the surface (lower surface) of scale plate 22, and measure the position in the 225 degrees direction (45 degrees direction) and in the Z-axis direction, the position in the 315 degrees direction (−45 degrees direction) and the Z-axis direction, and the position in the 45 degrees direction and the Z-axis direction of wafer tables WTB1 and WTB2.

As it can be seen from the description above, in this embodiment, regardless of irradiating the measurement beam (measurement light) either on scale plate 21 or 22, or in other words, regardless of whether wafer stages WST1 and WST2 are located in the exposure time movement area or the measurement time movement area, heads $60_1$ to $60_4$ configure two-dimensional encoder $70_1$ to $70_4$ along with the scale plates on which the measurement beam (measurement light) is irradiated, and heads $60_1$ to $60_4$ on wafer stage WST2 are to configure two-dimensional encoders $71_1$ to $71_4$, along with the scale plates on which the measurement beams (measurement lights) are irradiated.

The measurement values of each of the two-dimensional encoders (hereinafter shortly referred to as an encoder as appropriate) $70_1$ to $70_4$, and $71_1$ to $71_4$ are supplied to main controller 20 (refer to FIG. 6). Main controller 20 obtains the positional information of wafer table WTB1 and WTB2 within the exposure time movement area including the area right under projection optical system PL, based on the measurement values of at least three encoders (in other words, at least three encoders that output effective measurement values) which face the lower surface of (sections $21_1$ to $21_4$ configuring) scale plate 21 on which the two-dimensional diffraction grating RG is formed. Similarly, main controller 20 obtains the positional information of wafer table WTB1 and WTB2 within the measurement time movement area including the area right under alignment system ALG, based on the measurement values of at least three encoders (in other words, at least three encoders that output effective measurement values) which face the lower surface of (sections $22_1$ to $22_4$ configuring) scale plate 22 on which the two-dimensional diffraction grating RG is formed.

Further, in exposure apparatus 100 of the embodiment, the position of wafer stages WST1 and WST2 (wafer tables WTB1 and WTB2) can be measured with wafer interferometer system 18 (refer to FIG. 6), independently from encoder systems 70 and 71. Measurement results of wafer interferometer system 18 are used secondarily such as when correcting (calibrating) a long-term fluctuation (for example, temporal deformation of the scale) of the measurement results of encoder systems 70 and 71, or as backup at the time of output abnormality in encoder systems 70 and 71. Incidentally, details on wafer interferometer system 18 will be omitted.

Alignment system ALG is an alignment system of an off-axis method placed on the +X side of projection optical system PL away by a predetermined distance, as shown in FIG. 1. In the embodiment, as alignment system ALG, as an example, an FIA (Field Image Alignment) system is used which is a type of an alignment sensor by an image processing method that measures a mark position by illuminating a mark using a broadband (a wide band wavelength range) light such as a halogen lamp and performing image processing of the mark image. The imaging signals from alignment system ALG are supplied to main controller 20 (refer to FIG. 6), via an alignment signal processing system (not shown).

Incidentally, alignment system ALG is not limited to the FIA system, and an alignment sensor, which irradiates a coherent detection light to a mark and detects a scattered light or a diffracted light generated from the mark or makes two diffracted lights (for example, diffracted lights of the same order or diffracted lights being diffracted in the same direction) generated from the mark interfere and detects an interference light, can naturally be used alone or in combination as needed. As alignment system ALG, an alignment system having a plurality of detection areas like the one disclosed in, for example, U.S. Patent Application Publication No. 2008/0088843 can be employed.

Moreover, in exposure apparatus 100 of the embodiment, a multiple point focal point position detection system (hereinafter shortly referred to as a multipoint AF system) AF (not shown in FIG. 1, refer to FIG. 6) by the oblique incidence method having a similar configuration as the one disclosed in, for example, U.S. Pat. No. 5,448,332 and the like, is arranged at the measurement station together with alignment system ALG. At least a part of a measurement operation by the multipoint AF system AF is performed in parallel with the mark detection operation by alignment system ALG, and the positional information of the wafer table is also measured during the measurement operation by the encoder system previously described. Detection signals of multipoint AF system AF are supplied to main controller 20 (refer to FIG. 6) via an AF signal processing system (not shown). Main controller 20 detects positional information (step information/unevenness information) of the wafer W surface in the Z-axis direction based on the detection signals of multipoint AF system AF and the measurement information of the encoder system previously described, and in the exposure operation, performs a so-called focus leveling control of wafer W during the scanning exposure based on prior detection results and the measurement information (positional information in the Z-axis, the θx and θy directions) of the encoder system previously described. Incidentally, multipoint AF system can be arranged within the exposure station in the vicinity of projection unit PU, and at the time of exposure operation, the so-called focus leveling control of wafer W can be performed by driving the wafer table while measuring the surface position information (unevenness information) of the wafer surface.

In exposure apparatus 100, furthermore, above reticle R, a pair of reticle alignment detection systems 13A and 13B (not shown in FIG. 1, refer to FIG. 6) of a TTR (Through The Reticle) method which uses light of the exposure wavelength, as is disclosed in, for example, U.S. Pat. No. 5,646,413 and the like, is arranged. Detection signals of reticle alignment systems 13A and 13B are supplied to main controller 20 via an alignment signal processing system (not shown). Incidentally, reticle alignment can be performed using an aerial image measuring instrument (not shown) provided on wafer stage WST, instead of the reticle alignment system.

Figure 6:
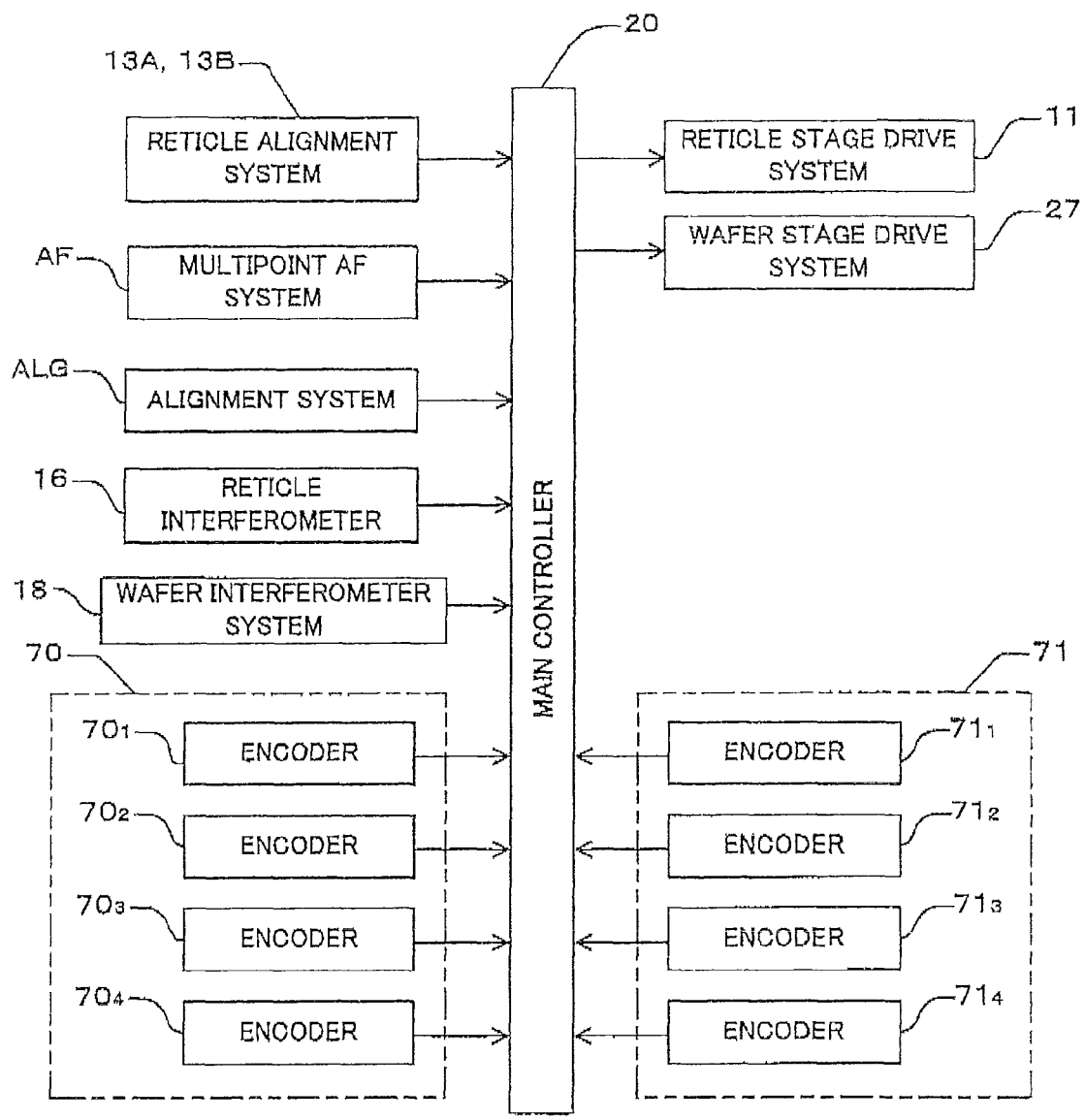
FIG. 6 is a block diagram showing the main configuration of the control system related with the stage control in the exposure apparatus in FIG. 1.

FIG. 6 is a block diagram showing a partially omitted control system related to stage control in exposure apparatus 100. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 100 configured in the manner described above, when manufacturing a device, main controller 20 moves one of wafer stages WST1 and WST2 on which the wafer is loaded within the measurement station (measurement time movement area), and the measurement operation of the wafer by alignment system ALG and multipoint AF system is performed. More specifically, in the measurement time movement area on the wafer held by one of wafer stages WST1 and WST2, mark detection using alignment system ALG, or the so-called wafer alignment (such as Enhanced Global Alignment (EGA) disclosed in, for example, U.S. Pat. No. 4,780,617 and the like) and measurement of the surface position (step/unevenness information) of the wafer using the multipoint AF system are performed. On such alignment, encoder system 70 (encoders $70_1$ to $70_4$) or encoder system 71 (encoders $71_1$ to $71_4$) obtains (measures) the positional information of wafer stages WST1 and WST2 in directions of six degrees of freedom (X, Y, Z, θx, θy, and θz).

After the measurement operation such as the wafer alignment and the like, one of the wafer stages (WST1 or WST2) is moved to exposure time movement area, and main controller 20 performs reticle alignment and the like in a procedure (a procedure disclosed in, for example, U.S. Pat. No. 5,646,413 and the like) similar to a normal scanning stepper, using reticle alignment systems 13A and 13B, fiducial mark plates (not shown) on the wafer table (WTB1 or WTB2) and the like.

Then, main controller 20 performs an exposure operation by the step-and-scan method, based on the measurement results of the wafer alignment and the like, and a pattern of reticle R is transferred onto each of a plurality of shot areas on wafer W. The exposure operation by the step-and-scan method is performed by alternately repeating a scanning exposure operation where synchronous movement of reticle stage RST and wafer stage WST1 or WST2 is performed, and a movement (stepping) operation between shots where wafer stage WST1 or WST2 is moved to an acceleration starting position for exposure of the shot area. At the time of the exposure operation, encoder system 70 (encoders $70_1$ to $70_4$) or encoder system 71 (encoders $71_1$ to $71_4$) obtains (measures) the positional information of one of the wafer stages WST1 or WST2, in directions of six degrees of freedom (X, Y, Z, θx, θy, and θz).

Further, exposure apparatus 100 of the embodiment is equipped with two wafer stages WST1 and WST2. Therefore, in parallel with performing an exposure by the step-and-scan method with respect to the wafer loaded on one of the wafer stages, such as, for example, wafer stage WST1, a parallel processing operation is performed in which wafer alignment and the like is performed on the wafer mounted on the other stage WST2.

In exposure apparatus 100 of the embodiment, as is previously described, main controller 20 obtains (measures) the positional information of wafer stage WST1 in directions of six degrees of freedom (X, Y, Z, θx, θy, and θz) using encoder system 70 (refer to FIG. 6), within both the exposure time movement area and the measurement time movement area. Further, main controller 20 obtains (measures) the positional information of wafer stage WST2 in directions of six degrees of freedom (X, Y, Z, θx, θy, and θz) using encoder system 71 (refer to FIG. 6), within both the exposure time movement area and the measurement time movement area.

Now, the principles of position measurement in directions of three degrees of freedom (also shortly referred to as the X-axis direction, the Y axis direction and the θz direction (X, Y, θ z)) within the XY plane by encoder systems 70 and 71 are further described. Here, measurement results or measurement values of encoder heads $60_1$ to $60_4$ or encoders $70_1$ to $70_4$ refer to measurement results of encoder heads $60_1$ to $60_4$ or encoders $70_1$ to $70_4$ in the measurement direction which is not in the Z-axis direction.

In the embodiment, by employing a configuration and an arrangement of encoder heads $60_1$ to $60_4$ and scale plate 21 as is previously described, at least three of the encoders head $60_1$ to $60_4$ constantly face (corresponding sections $21_1$ to $21_4$ of) scale plate 21 within the exposure time movement area.

FIG. 7 shows a relation between a placement of encoder heads $60_1$ to $60_4$ on wafer stage WST1 and each of the sections $21_1$ to $21_4$ of scale plate 21, and measurement areas $A_0$ to $A_4$ of encoder system 70. Incidentally, because the configuration of wafer stage WST2 is similar to wafer stage WST1, the description here will be made only on wafer stage WST1.

When the center (coincides with the center of the wafer) of wafer stage WST1 is located in the exposure time movement area, and within a first area $A_1$ which is an area on the +X and +Y sides with respect to exposure center (center of exposure area IA) P (an area within a first quadrant whose origin is exposure center P (except for area $A_0$)), heads $60_4$, $60_1$, and $60_2$ on wafer stage WST1 face sections $21_4$, $21_1$, and $21_2$ of scale plate 21, respectively. In the first area $A_1$, effective measurement values are sent to main controller 20 from these heads $60_4$, $60_1$, and $60_2$ (encoders $70_4$, $70_1$, and $70_2$). Incidentally, the position of wafer stages WST1 and WST2 in the description below, will refer to the position in the center of the wafer stages (coincides with the center of the wafer). In other words, instead of using the description of the position in the center of wafer stages WST1 and WST2, the description the position of wafer stages WST1 and WST2 will be used.

Similarly, when wafer stage WST1 is located in the exposure time movement area, and also within a second area $A_2$, which is an area (an area (except for area $A_0$) within the second quadrant whose origin is exposure center P) on the $-X$ side and also on the $+Y$ side with respect to exposure center P, heads $60_1$, $60_2$, and $60_3$ face sections $21_1$, $21_2$, and $21_3$ of scale plate 21, respectively. When wafer stage WST1 is located in the exposure time movement area, and also within a third area $A_3$, which is an area (an area (except for area $A_0$) within the third quadrant whose origin is exposure center P) on the $-X$ side and also on the $-Y$ side with respect to exposure center P, heads $60_2$, $60_3$, and $60_4$ face sections $21_2$, $21_3$, and $21_4$ of scale plate 21, respectively. When wafer stage WST1 is located in the exposure time movement area, and also within a fourth area $A_4$, which is an area (an area (except for area $A_0$) within the fourth quadrant whose origin is exposure center P) on the $+X$ side and also on the $-Y$ side with respect to exposure center P, heads $60_3$, $60_4$, and $60_1$ face sections $21_3$, $21_4$, and $21_1$ of scale plate 21, respectively.

Figure 7A:
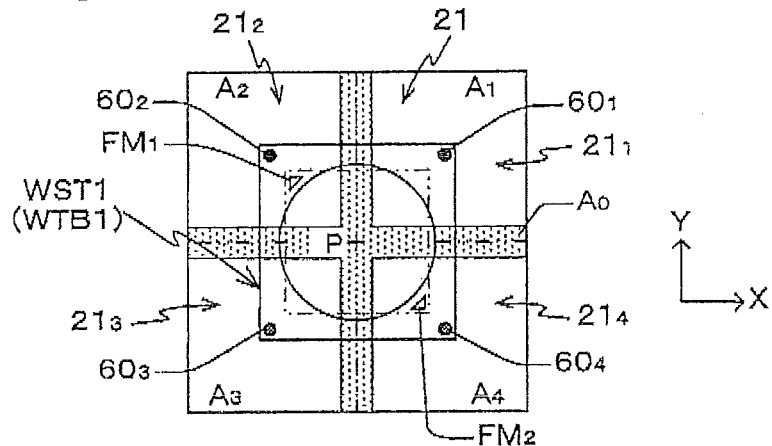
FIG. 7A is a view showing a relation between a placement of encoder heads and a scale plate and a measurement area of the encoder system.

In the embodiment, under a condition ($A \geq a_i+2t$, $B \geq b_i+2t$) of the configuration and arrangement of encoder heads $60_1$ to $60_4$ and scale plate 21 previously described, as shown in FIG. 7A, in the case wafer stage WST1 is positioned within a cross-shaped area $A_0$ (an area whose longitudinal direction is in the Y-axis direction and has a width $A-a_i-2t$ and an area an area whose longitudinal direction is in the X-axis direction and has a width $B-b_i-2t$ that pass through exposure center P (hereinafter referred to as a zeroth area)) in which exposure position P serves as the center, all of the heads $60_1$ to $60_4$ on wafer stage WST1 face scale plate 21 (sections $21_1$ to $21_4$ corresponding to the heads). Accordingly, within the zeroth area $A_0$, effective measurement values from all of the heads $60_1$ to $60_4$ (encoders $70_1$ to $70_4$) are sent to main controller 20. Incidentally, in the embodiment, in addition to the conditions ($A \geq a_i+2t$, $B \geq b_i+2t$) described above, condition $A \geq a_i+W+2t$, $B \geq b_i+L+2t$ may be added taking into consideration the size (W, L) of the shot area on the wafer in which the pattern is formed. In this case, W and L are the width of the shot area in the X-axis direction and the Y axis direction, respectively. W and L are equal to the distance of the scanning exposure section and the distance of stepping in the X-axis direction, respectively.

Main controller 20 computes the position (X, Y, θ z) of wafer stage WST1 in the XY plane, based on measurement results of heads $60_1$ to $60_4$ (encoders $70_1$ to $70_4$). In this case, measurement values (each described as $C_1$ to $C_4$) of encoders $70_1$ to $70_4$ depend upon the position (X, Y, θz) of wafer stage WST1 as in formulas (1) to (4) below.

$$C_1 = -(\cos\theta z + \sin\theta z)X/\sqrt{2} + (\cos\theta z - \sin\theta z)Y/\sqrt{2} + \sqrt{2}p\sin\theta z \tag{1}$$

$$C_2 = -(\cos\theta z - \sin\theta z)X/\sqrt{2} - (\cos\theta z + \sin\theta z)Y/\sqrt{2} + \sqrt{2}p\sin\theta z \tag{2}$$

$$C_3 = (\cos\theta z + \sin\theta z)X/\sqrt{2} - (\cos\theta z - \sin\theta z)Y/\sqrt{2} + \sqrt{2}p\sin\theta z \tag{3}$$

$$C_4 = (\cos\theta z - \sin\theta z)X/\sqrt{2} + (\cos\theta z + \sin\theta z)Y/\sqrt{2} + \sqrt{2}p\sin\theta z \tag{4}$$

However, as shown in FIG. 5, p is the distance of the head in the X-axis and the Y-axis directions from the center of wafer table WTB1 (WTB2).

Main controller 20 specifies three heads (encoders) facing scale plate 21 according to areas $A_0$ to $A_4$ where wafer stage WST1 is positioned and forms a simultaneous equation by choosing from the formulas (1) to (4) above the formula which the measurement values of the three heads follow, and by solving the simultaneous equation using the measurement values of the three heads (encoders), computes the position (X, Y, θz) of wafer sage WST1 in the XY plane. For example, when wafer stage WST1 is located in the first area $A_1$, main controller 20 forms a simultaneous equation from formulas (1), (2) and (4) that measurement values of heads $60_1$, $60_2$, and $60_4$ (encoders $70_1$, $70_2$, and $70_4$) follow, and solves the simultaneous equation by substituting the measurement values of each of the heads into the left side of formulas (1), (2) and (4), respectively. The position (X, Y, θz) which is calculated is expressed as $X_1$, $Y_1$, and $\theta z_1$. Similarly, in the case wafer stage WST1 is located in a $k^{th}$ area $A_k$, main controller 20 forms a simultaneous equation from formulas (k-1) (k), and (k+1) that measurement values of heads head $60_{k-1}$, $60_k$, and $60_{k+1}$ (encoders $70_{k-1}$, $70_k$, and $70_{k+1}$) follow, and solves the simultaneous equation by substituting the measurement values of each head into the left side of the formulas. By solving the equation, position (Xk, Yk, $\theta z_k$) is computed. Here, the numbers from 1 to 4 which is periodically replaced is substituted into k-1, k and k+1.

Incidentally, in the case wafer stage WST1 is located in the zeroth area $A_0$, main controller 20 can randomly select three heads from heads $60_1$ to $60_4$ (encoders $70_1$ to $70_4$). For example, after the first wafer stage WST1 has moved from the first area to the zeroth area, heads $60_1$, $60_2$, and $60_4$ (encoders $70_1$, $70_2$, and $70_4$) corresponding to the first area are preferably selected.

Main controller 20 drives (position control) wafer stage WST1 within the exposure time movement area, based on the computation results ($X_k$, $Y_k$, $\theta z_k$) above.

In the case wafer stage WST1 is located within measurement time movement area, main controller 20 measures the positional information in directions of three degrees of freedom (X, Y, θz), using encoder system 70. The measurement principle and the like, here, is the same as in the case when wafer stage WST1 is located within the measurement time movement area, except for the point where exposure center P is replaced with the detection center of alignment system ALG, and (sections $21_1$ to $21_4$ of) scale plate 21 is replaced with (sections $22_1$ to $22_4$ of) scale plate 22.

Furthermore, main controller 20 switches and uses three heads that includes at least one different head, out of heads $60_1$ to $60_4$ that face scale plates 21 and 22, according to the position of wafer stages WST1 and WST2. In this case, when switching the encoder head, a linkage process to secure the continuity of the position measurement results of the wafer stage is performed, as is disclosed in, for example, U.S. Patent Application Publication No. 2008/0094592 and the like.

As previously described, scale plates 21 and 22 in exposure apparatus 100 of the embodiment are configured of four sections, $21_1$ to $21_4$, and $22_1$ to $22_4$, respectively. When the four sections, or to be more exact, two-dimensional diffraction grating RG formed on the lower surface of the four sections, are displaced with one another, a measurement error occurs in encoder systems 70 and 71.

Figure 7B:
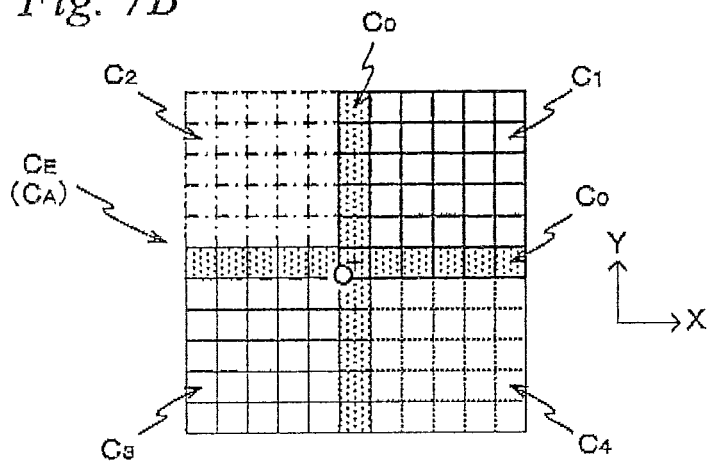
FIG. 7B is a view showing four stage coordinate systems which are set corresponding to four sets of encoder heads facing the scale plate.
Figure 7C:
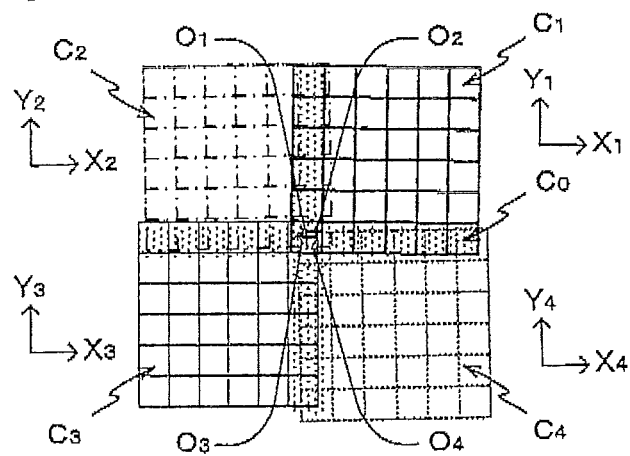
FIG. 7C is a view showing a case when there is a displacement reciprocally in the four sections of the scale plate.

FIGS. 7B and 7C typically shows a $k^{th}$ reference coordinate system $C_k$ (k=1-4) corresponding to the position ($X_k$, $Y_k$, $\theta z_k$) of wafer stages WST1 or WST2 computed from effective measurement values of heads $60_{k-1}$, $60_k$, and $60_{k+1}$ (encoder $70_{k-1}$, $70_k$, and $70_{k+1}$ or encoders $71_{k-1}$, $71_k$, and $71_{k+1}$) within the $k^{th}$ area $A_k$ (k=1-4). The four reference coordinate systems $C_1$ to $C_4$ correspond to the placement of areas $A_1$ to $A_4$ (refer to FIG. 7A) and overlap one another in the vicinity of origin O, which serves as a center of a cross-shaped area $C_0$ where adjacent reference coordinate systems overlap one another.

When scale plate 21 is configured as designed, or in other words, in the case two-dimensional diffraction grating RG formed on the four sections $21_1$ to $21_4$ are not displaced with one another, origin O1 to O4 of the four reference coordinate systems $C_1$ to $C_4$ coincide with one another (shown using reference code O in the drawing) as shown in FIG. 7B, as well as rotation $\theta z_1$ to $\theta z_4$, and scaling $\Gamma x_1$ to $\Gamma x_4$ and $\Gamma y_1$ to $\Gamma y_4$. Accordingly, the four reference coordinate system can be combined into one coordinate system $C_E$. In other words, the position of wafer stages WST1 and WST2 within exposure time movement areas $A_1$ to $A_4$ can be expressed using position coordinate X, Y, and $\theta z$ in a combined coordinate system $C_E$.

However, when two-dimensional diffraction grating RG formed on the four sections $21_1$ to $21_4$ are displaced with one another, origin $O_1$ to $O_4$ of each of the four reference coordinate systems $C_1$ to $C_4$, rotation $\theta z_1$ to $\theta z_4$, and scaling $\Gamma x_1$ to $\Gamma x_4$ and $\Gamma y_1$ to $\Gamma y_4$ are displaced as shown in FIG. 7C, and measurement error occurs with such displacement. Therefore, the four reference coordinate systems cannot be combined to one coordinate system $C_E$ like the example shown in FIG. 7B.

Similarly, when the four sections $22_1$ to $22_4$ configuring scale plate 22, or to be more exact, two-dimensional diffraction grating RG formed on the lower surface of the four sections $22_1$ to $22_4$, are displaced with each other, a measurement error occurs in encoder system 70 or 71.

Therefore, in the embodiment, a calibration method is employed, so as to calibrate the four reference coordinate systems $C_1$ to $C_4$ which are displaced with one another due to displacement between sections $21_1$ to $21_4$, and $22_1$ to $22_4$ configuring scale plates 21 and 22. Now, details of a calibration method will be described, referring to scale plate 21 as an example.

Figure 8A:
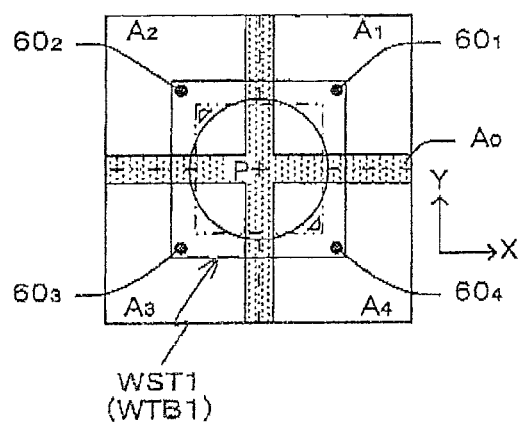
FIGS. 8A, 8C, and 8E are views (Nos. 1, 2, and 3) showing a movement of the wafer stage in stage position measurement to calibrate a stage coordinate.

First of all, main controller 20 positions wafer stage WST1 (WST2) within area $A_0$, as shown in FIG. 8A. In FIG. 8A, wafer stage WST1 is positioned in the center (right under projection optical system PL) of area $A_0$. In area $A_0$, all of the heads $60_1$ to $60_4$ installed on wafer stage WST1 faces (corresponding sections $21_1$ to $21_4$ of) scale plate 21, and sends effective measurement values to main controller 20. Main controller 20 obtains position ($X_k$, $Y_k$, $\theta z_k$) of wafer stage WST1, using measurement values of heads $60_{k-1}$, $60_k$, and $60_{k+2}$ (referred to as a $k^{th}$ head group) which are used in the k (=1 to 4)$^{th}$ area $A_k$. Main controller 20 obtains a displacement of position ($X_k$, $Y_k$) computed from measurement values of the k (=2 to 4)$^{th}$ head group with respect to position ($X_1$, $Y_1$) computed from measurement values of the first head group, or in other words, obtains an offset ($O_{Xk} = X_k - X_1$, $O_{Yk} = Y_k - Y_1$).

Incidentally, with offset ($O_{Xk}$, $O_{Yk}$), an offset ($O_{\theta zk} = \theta z_k - \theta z_1$) of rotation $\theta z$ can also be obtained at the same time. In this case, computation of offset $O_{\theta zk}$ described below is to be omitted.

Figure 8B:
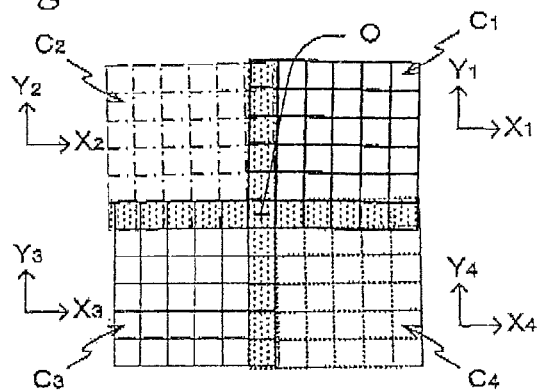
FIGS. 8B, 8D, and 8F are views (Nos. 1, 2, and 3) used to explain calibration of the four stage coordinate systems (the one or two and 3)

The offset ($O_{Xk}$, $O_{Yk}$) obtained above is used to correct position ($X_k$, $Y_k$) computed from measurement values of the k (=2 to 4)$^{th}$ head group to ($X_k - O_{Xk}$, $Y_k - O_{Yk}$). By this correction, origin $O_K$ of the k (=2 to 4)$^{th}$ reference coordinate system $C_k$ coincides with origin $O_1$ of the first reference coordinate system $C_1$ as shown in FIG. 8B. In the figure, the origin coinciding with each other is indicated by reference code O.

Figure 8C:
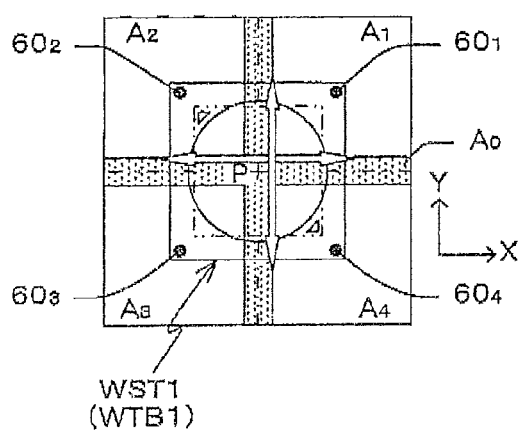

Next, as shown in FIG. 8C, main controller 20 drives wafer stage WST1 in area $A_0$ in the direction of the arrow (the X-axis direction and the Y-axis direction), based on a stage position ($X_1$, $Y_1$, $\theta z_1$) computed from the measurement values of the first head group serving as a reference on calibration, while setting a position by each predetermined pitch and obtaining four of position ($X_k$, $Y_k$ (k=1 to 4)) of wafer stage WST1, using the measurement values of the four heads groups.

Main controller 20 decides offset $O_{\theta zk}$ by a least-square calculation so that square error $\epsilon_k = \Sigma((\xi_k - X_1)^2 + (\zeta_k - Y_1)^2)$ becomes minimal, using the four stage positions ($X_k$, $Y_k$ (k=1 to 4)) obtained above. However, k=2 to 4. In this case, ($\xi_k$, $\zeta_k$) is stage position ($X_k$, $Y_k$ (k=2 to 4)), to which rotational transformation has been applied using formula (5) below. In this case, while the least-squares method is used as an example to obtain offset O$\theta$zk, other computing methods can also be used.

$$\begin{pmatrix} \xi_k \\ \zeta_k \end{pmatrix} = \begin{pmatrix} \cos O_{\theta zk} & -\sin O_{\theta zk} \\ \sin O_{\theta zk} & \cos O_{\theta zk} \end{pmatrix} \begin{pmatrix} X_k \\ Y_k \end{pmatrix} \quad (5)$$

Figure 8D:
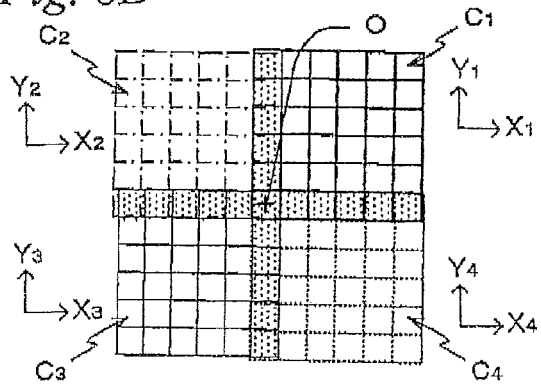

Offset $O_{\theta zk}$ obtained above is used by to correct rotation $\theta z_k$ computed from measurement values of the k (=2 to 4)$^{th}$ head group to $\theta z_k - O_{\theta zk}$. By this correction, the direction (rotation) of the $k^{th}$ reference coordinate system $C_k$ (=2 to 4) coincides with the direction (rotation) of the first reference coordinate system $C_1$, as shown in FIG. 8D.

Figure 8E:
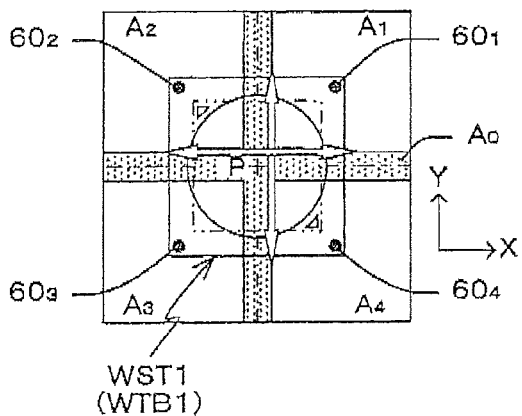

Next, as shown in FIG. 8E, main controller 20 drives wafer stage WST1 in area $A_0$ in the direction of the arrow (the X-axis direction and the Y-axis direction), based on a stage position ($X_1$, $Y_1$, $\theta z_1$), while setting a position by each predetermined pitch and obtaining four of position ($X_k$, $Y_k$ (k=1 to 4)) of wafer stage WST1, as in the earlier case.

Main controller 20 decides scaling ($\Gamma_{Xk}$, $\Gamma_{Yk}$) by a least-square calculation so that square error $\epsilon k = \Sigma((\xi_k' - X_1)^2 + (\zeta_k' - Y_1)^2)$ becomes minimal, using the four stage positions ($X_k$, $Y_k$ (k=1-4)) obtained above. However, k=2 to 4. In this case, ($\xi_k'$, $\zeta_k'$) is stage position ($X_k$, $Y_k$ (k=2-4)), to which scale transformation has been applied using formula (6) below.

$$\begin{pmatrix} \xi_k' \\ \zeta_k' \end{pmatrix} = \begin{pmatrix} 1 + \Gamma_{Xk} & 0 \\ 0 & 1 + \Gamma_{Yk} \end{pmatrix} \begin{pmatrix} X_k \\ Y_k \end{pmatrix} \quad (6)$$

Figure 8F:
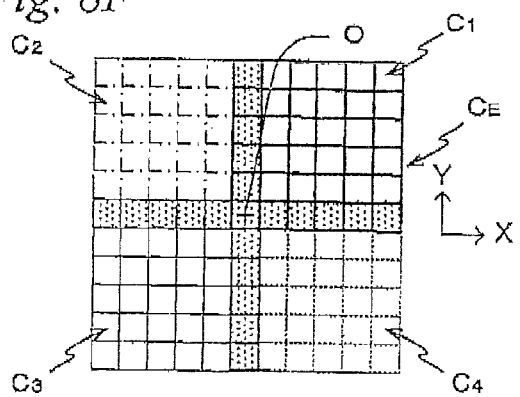

Scaling ($\Gamma_{Xk}$, $\Gamma_{Yk}$) obtained above is used to correct position ($X_k$, $Y_k$) computed from measurement values of the k (=2 to 4)$^{th}$ head group to ($X_k/(1+\Gamma_{Xk})$, $Y_k/(1+\Gamma_{Yk})$). By this correction, the scaling of the $k^{th}$ reference coordinate system $C_k$ (=2 to 4) coincides with the scaling of the first reference coordinate system $C_1$ as shown in FIG. 8F.

The four reference coordinate systems $C_1$ to $C_4$ whose position, rotation, and scaling have been calibrated by the processing described above are combined into one coordinate system (a combined coordinate system) $C_E$ which covers exposure time movement area $A_0$ to $A_4$.

Incidentally, instead of the processing described so far, the offset and scaling ($O_{Xk}$, $O_{Yk}$, $O_{\theta zk}$, $\Gamma_{Xk}$, $\Gamma_{Yk}$ (k=2-4)) can also be obtained by the following processing. In other words, as shown in FIGS. 8C and 8E, main controller 20 drives wafer stage WST1 in area $A_0$ in the direction of the arrow (the X-axis direction and the Y-axis direction), based on a stage position ($X_1$, $Y_1$, $\theta z_1$), while setting a position by each predetermined pitch and obtaining four of position ($X_k$, $Y_k$ (k=1-4)) of wafer stage WST1. An offset and scaling ($O_{Xk}$, $O_{Yk}$, $O_{\theta zk}$, $\Gamma_{Xk}$, $\Gamma_{Yk}$) are determined by least square operation so that main controller 20 uses four ways of bought stage location ($X_k$, $Y_k$ (k=1-4)), and square error $\epsilon_k = \Sigma((\xi''_k - X_1)^2 + (\zeta''_k - Y_1)^2)$ is minimized. However, k=2 to 4. In this case, ($\xi''_k$, $\zeta''_k$) is stage position ($X_k$, $Y_k$ (k=2-4)) to which transformation has been applied using formula (7) below.

$$\begin{pmatrix} \xi''_k \\ \zeta''_k \end{pmatrix} = \begin{pmatrix} 1+\Gamma_{Xk} & 0 \\ 0 & 1+\Gamma_{Yk} \end{pmatrix} \begin{pmatrix} \cos O_{\theta zk} & -\sin O_{\theta zk} \\ \sin O_{\theta zk} & \cos O_{\theta zk} \end{pmatrix} \begin{pmatrix} X_k \\ Y_k \end{pmatrix} + \begin{pmatrix} O_{Xk} \\ O_{Yk} \end{pmatrix} \quad (7)$$

Further, in the processing above, while the offset and scaling of the second to fourth reference coordinate systems $C_2$ to $C_4$ were obtained directly with the first reference coordinate system $C_1$, the offset and scaling can also be obtained indirectly. For example, the offset and scaling ($O_{X2}$, $O_{Y2}$, $O_{\theta z2}$, $\Gamma_{X2}$, $\Gamma_{Y2}$) is obtained for the second reference coordinate system $C_2$ which uses the first reference coordinate system $C_1$ as a reference according to the procedure described above. Similarly, the offset and scaling ($O_{X32}$, $O_{Y32}$, $O_{\theta z32}$, $\Gamma_{X32}$, $\Gamma_{Y32}$) is obtained for the third reference coordinate system $C_3$ which uses the second reference coordinate system $C_2$ as a reference. From these results, an offset and scaling for the third reference coordinate system $C_3$ using the first reference coordinate system $C_1$ as a reference can be obtained ($O_{X3}=O_{X32}+O_{X2}$, $O_{Y3}=O_{Y32}+O_{Y2}$, $O_{\theta z3}=O_{\theta z32}+O_{\theta z2}$, $\Gamma_{X3}=\Gamma_{X32}\cdot\Gamma_{X2}$, $\Gamma_{Y3}=\Gamma_{Y32}\cdot\Gamma_{Y2}$). Similarly, the offset and scaling of the fourth reference coordinate $C_4$ using the third reference coordinate system $C_3$ can be obtained, and the offset and scaling of the fourth reference coordinate $C_4$ using the first reference coordinate system $C_1$ as a reference can also be obtained using the results.

Main controller 20 also calibrates the four reference coordinates with respect to scale plate 22 according to a similar procedure, and combines the four reference coordinate systems into one coordinate system (a combined coordinate system) $C_A$ (refer to FIG. 7B) which covers alignment time movement area.

Figure 9A:
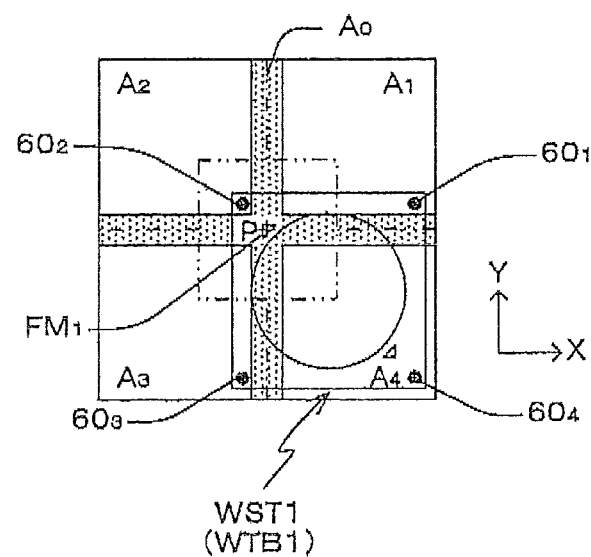
FIGS. 9A and 9B are views used to explain an origin, rotation, and measurement of scaling of combined stage coordinate system $C_E$.
Figure 9B:
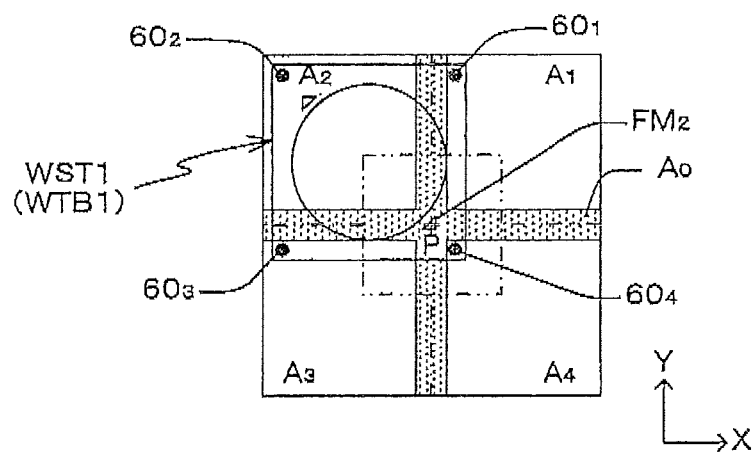

Finally, main controller 20 obtains the displacement of the position, rotation, and scaling between combined coordinate system $C_E$ which covers the exposure time movement areas $A_0$ to $A_4$ and combined coordinate system $C_A$ which covers the alignment time movement area. As shown in FIG. 9A, main controller 20 obtains (measures) the positional information of wafer stage WST1 using encoder system 70, and drives wafer stage WST1 based on the results and positions the first fiducial mark plate FM1 on wafer table WTB1 directly under (exposure center P of) projection optical system PL. Main controller 20 detects two (a pair of) reference marks formed on first fiducial mark plate FM1, using a pair of reticle alignment systems 13A and 13B. Then, main controller 20 drives wafer stage WST1 based on measurement results of encoder system 70, and positions the second fiducial mark plate FM2 on wafer table WTB1 directly under (exposure center P of) projection optical system PL, and detects a reference mark formed on second fiducial mark plate FM2 using one of the pair of reticle alignment systems 13A and 13B. Main controller 20 obtains the position of the origin, rotation, and scaling of combined coordinate system $C_E$ from the detection results (in other words, the two-dimensional position coordinates of the three reference marks) of the three reference marks.

Figure 10A:
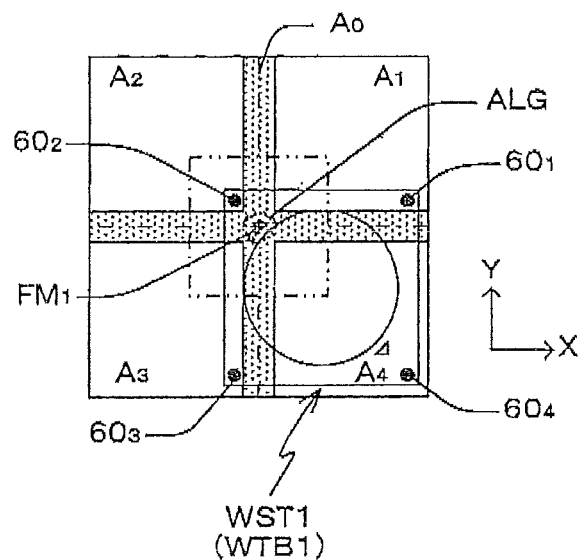
FIGS. 10A and 10B are views used to explain an origin, rotation, and measurement of scaling of combined stage coordinate system $C_A$.
Figure 10B:
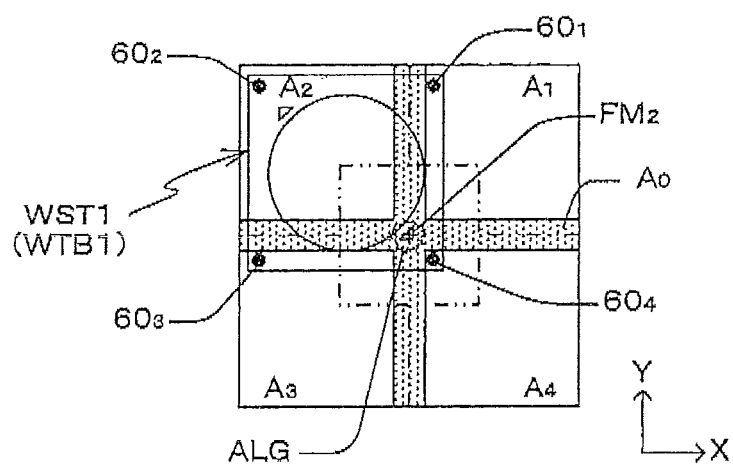

Main controller 20 moves wafer stage WST1 to the measurement time movement area. Here, main controller 20 measures the positional information of wafer stage WST1, using wafer interferometer system 18 in the area between exposure time movement area $A_0$ to $A_4$ and the measurement time movement area and encoder system 70 in the measurement time movement area, and drives (controls the position of) wafer stage WST1 based on the results. After the movement, as shown in FIGS. 10A and 10B, main controller 20 detects the three reference marks as is previously described using alignment system ALG, and obtains the position of the origin, rotation and scaling of combined coordinate system $C_A$ from the detection results. Incidentally, while it is desirable for the three reference marks subject to detection of reticle alignment system 13A to be the same marks as the three reference marks subject to detection of alignment system ALG, when the same reference marks cannot be detected in reticle alignment systems 13A and 13B and alignment system ALG, different reference marks can be subject to detection in reticle alignment systems 13A and 13B and alignment system ALG since the positional relation between the reference marks is known.

Incidentally, also in the case when the wafer stage is moved between the exposure time movement area and the measurement time movement area, position control of the wafer stage can be performed using then encoder system. Further, a linkage process (a phase linkage and/or a coordinate linkage) is performed in each of the exposure time movement area and the measurement time movement area. Coordinate linkage, in this case, refers to a linkage process of setting a measurement value with respect to an encoder which will be used after the switching so that the position coordinate of wafer stage WST which is computed coincides completely before and after the switching of the encoder (head), and to re-set the phase offset on this setting. While the phase linkage method is basically similar to a coordinate linkage method, usage of the phase offset is different, and the phase linkage method refers to a linkage method in which the phase offset which is already set is continuously used without resetting the phase offset, and only the counter value is re-set.

Main controller 20 obtains the displacement of the origin, rotation, and scaling between combined coordinate systems $C_E$ and $C_A$ from the position of origin, rotation, and scaling of combined coordinate system $C_E$ and the position of origin, rotation, and scaling of combined coordinate system $C_A$. Main controller 20 can use this displacement, for example, to convert results of wafer alignment measured on combined coordinate system $C_A$, such as for example, to convert array coordinates (or a position coordinate of an alignment mark on the wafer) of a plurality of shot area on the wafer to an array coordinate of a plurality of shot areas on the wafer on combined coordinate system $C_E$, and drives (controls the position of) wafer stage WST1 on combined coordinate system $C_E$ at the time of wafer exposure, based on the array coordinates which have been converted.

Main controller 20 performs the calibration method described above each time exposure processing of a wafer (or each time exposure processing of a predetermined number of wafers) is performed. In other words, prior to wafer alignment using alignment system ALG, encoder systems 70 and 71 are calibrated on the usage of scale plate 22 as previously described (the four reference coordinate systems $C_1$ to $C_4$ are combined into combined coordinate system $C_A$). Measurement operations such as wafer alignment to the wafer subject to exposure are performed, using encoder systems 70 and 71 which have been calibrated (on combined coordinate system $C_A$). Successively, prior to the exposure processing of the wafer, encoder systems 70 and 71 are calibrated on the usage of scale plate 22 as previously described (the four reference coordinate systems $C_1$ to $C_4$ are combined into combined coordinate system $C_E$). Further, displacement (relative position, relative rotation, and relative scaling) of the position, rotation, and scaling between combined coordinate systems $C_A$ and $C_E$ is obtained. Results (for example, array coordinates of a plurality of shot areas on the wafer) of wafer alignment measured on combined coordinate system $C_A$ using these results are converted into array coordinates of a plurality of shot areas on the wafer on combined coordinate system $C_E$, and exposure processing on the wafer is performed by driving (controlling the position of) wafer stages WST1 and WST2 holding the wafer on combined coordinate system $C_E$, based on the array coordinates after the conversion.

Incidentally, as the calibration process (calibration method), while the measurement values of the encoder system can be corrected, other processing can also be employed. For example, other methods can also be applied, such as driving (performing position control of) the wafer stage while adding an offset to the current position or the target position of the wafer stage with the measurement errors serving as an offset, or correcting the reticle position only by the measurement error.

Next, the principle of position measurement in directions of three degrees of freedom (Z, θx, θy) by encoder systems 70 and 71 will be further described. Here, measurement results or measurement values of encoder heads $60_1$ to $60_4$ or encoders 701 to 704 refer to measurement results of encoder heads $60_1$ to $60_4$ or encoders 701 to 704 in the Z-axis direction.

In the embodiment, by employing a configuration and an arrangement of encoder heads $60_1$ to $60_4$ and scale plate 21 as is previously described, at least three of the encoders head $60_1$ to $60_4$ face (corresponding sections $21_1$ to $21_4$ of) scale plate 21 according to area $A_0$ to $A_4$ where wafer stage WST1 (or WST2) is located within the exposure time movement area. Effective measurement values are sent to main controller 20 from the heads (encoders) facing scale plate 21.

Main controller 20 computes the position (Z, θx, θy) of wafer table WTB1 (or WTB2), based on measurement results of encoders $70_1$ to $70_4$ (or $71_1$ to $71_4$). Here, the measurement values (each expressed as $D_1$ to $D_4$, respectively, to distinguish the values from measurement values $C_1$ to $C_4$ in a measurement direction which is not in the Z-axis direction as is previously described, namely, in a uniaxial direction in the XY plane) of encoders $70_1$ to $70_4$ (or $71_1$ to $71_4$) in the Z-axis direction depend upon the position (Z, θx, θy) of wafer stage WST1 (or WST2) as in formulas (8) to (11) below.

$$D_1 = -p \tan \theta y + p \tan \theta x + Z \quad (8)$$

$$D_2 = p \tan \theta y + p \tan \theta x + Z \quad (9)$$

$$D_3 = p \tan \theta y - p \tan \theta x + Z \quad (10)$$

$$D_4 = -p \tan \theta y - p \tan \theta x + Z \quad (11)$$

However, p is the distance (refer to FIG. 5) of the head in the X-axis and the Y-axis directions from the center of wafer table WTB1 (WTB2).

Main controller 20 selects the formulas that the measurement values of the three heads (encoders) follow according to areas $A_0$ to $A_4$ where wafer stage WST1 (WST2) is positioned from formula (8) to (11) described above, and by substituting and solving the measurement values of the three heads (encoders) into the simultaneous equation built from the three formulas which were selected, the position (Z, θx, θy) of wafer table WTB1 (WTB2) is computed. For example, when wafer stage WST1 (WST2) is located in the first area $A_1$, main controller 20 forms a simultaneous equation from formulas (8), (9) and (11) that measurement values of heads $60_1$, $60_2$, and $60_4$ (encoders $70_1$, $70_2$, and $70_4$) follow, and solves the simultaneous equation by substituting the measurement values into the left side of formulas (8), (9) and (11), respectively. The position (Z, θx, θy) which is calculated is expressed as $Z_1$, $\theta x_1$, and $\theta y_1$. Similarly, in the case wafer stage WST1 is located in a $k^{th}$ area $A_k$, main controller 20 forms a simultaneous equation from formulas ((k−1)+7), (k+7), and ((k+1)+7) that measurement values of heads head $60_{k-1}$, $60_k$, and $60_{k+1}$ (encoders $70_{k-1}$, $70_k$, and $70_{k+1}$) follow, and solves the simultaneous equation by substituting the measurement values of each head into the left side of formulas ((k−1)+7) (k+7) and ((k+1)+7). By solving the equation, position ($Z_k$, $\theta x_k$, $\theta y_k$) is computed. Here, the numbers from 1 to 4 which is periodically replaced is substituted into k−1, k and k+1.

Incidentally, in the case wafer stage WST1 (or WST2) is located in the $0^{th}$ area $A_0$, three heads from heads $60_1$ to $60_4$ (encoders $70_1$ to $70_4$ or $71_1$ to $71_4$) can be randomly selected, and a simultaneous equation made from the formulas that the measurement values of the selected three heads follow can be used.

Based on the computation results ($Z_k$, $\theta x_k$, $\theta y_k$) and step information (focus mapping data) previously described, main controller 20 performs a focus leveling control on wafer table WTB1 (WTB2) within the exposure time movement area.

In the case wafer stage WST1 (or WST2) is located within measurement time movement area, main controller 20 measures the positional information in directions of three degrees of freedom (Z, θx, θy) of wafer table WTB1 (WTB2) using encoder system 70 or 71. The measurement principle and the like, here, is the same as in the case when wafer stage WST1 is located within the exposure time movement area previously described, except for the point where the exposure center is replaced with the detection center of alignment system ALG, and (sections $21_1$ to $21_4$ of) scale plate 21 is replaced with (sections $22_1$ to $22_4$ of) scale plate 22. Based on the measurement results of encoder system 70 or 71, main controller 20 performs a focus leveling control on wafer table WTB1 (WTB2). Incidentally, in the measurement time movement area (measurement station), focus leveling does not necessarily have to be performed. In other words, a mark position and the step information (focus mapping data) should be obtained in advance, and by deducting the Z tilt of the wafer stage at the time of obtaining the step information from the step information, the step information of the reference surface of the wafer stage, such as the step information with the upper surface serving as the reference surface, should be obtained. And, at the time of exposure, focus leveling becomes possible based on the positional information in directions of three degrees of freedom (Z, θx, θy) of this step information and (the reference surface of) the wafer surface.

Furthermore, main controller 20 switches and uses three heads that include at least one different head out of heads $60_1$ to $60_4$ that face scale plates 21 and 22, according to the position of wafer stages WST1 and WST2. In this case, when an encoder head is switched, the linkage process is performed to secure the continuity of the measurement results of the position of wafer table WTB1 (or WTB2).

As previously described, scale plates 21 and 22 in exposure apparatus 100 of the embodiment are configured of four sections, $21_1$ to $21_4$, and $22_1$ to $22_4$, respectively. When the height and tilt of the four sections are displaced with one another, a measurement error occurs in encoder systems 70 and 71. Therefore, the calibration method as is previously described is employed so as to calibrate the four reference coordinate system $C_1$ to $C_4$ which are displaced with one another due to displacement of height and tilt between sections $21_1$ to $21_4$, and $22_1$ to $22_4$.

Now, an example of a calibration method will be described, with a case using encoder system 70 as an example.

Main controller 20, as shown in FIGS. 8C and 8E, drives wafer stage WST1 in area $A_0$ in the direction of the arrow (the X-axis direction and the Y-axis direction), based on measurement results $(X_1, Y_1, \theta z_1)$ of the position of wafer stage WST1 measured by encoder system 70, while setting a position by each predetermined pitch and obtaining four of position $(Z_k, \theta x_k, \theta y_k$ (k=1-4)) of wafer table WTB1, using the measurement values of the four heads groups. Using these results, main controller 20 obtains the displacement of position $(Z_k, \theta x_k, \theta y_k)$ computed from the measurement values of the k (=2-4)$^{th}$ head group with respect to position $(Z_1, \theta x_1, \theta y_1)$ computed from the measurement values of the first head group, or in other words, obtains an offset $(O_{Zk}=Z_k-Z_1, O_{\theta xk}=\theta x_k-\theta x_1, O_{\theta yk}=\theta y_k-\theta y_1)$. Furthermore, main controller 20 averages offset $(O_{Zk}, O_{\theta xk}, O_{\theta yk})$ which is obtained for each positioning.

The offset $(O_{Zk}, O_{\theta xk}, O_{\theta yk})$ obtained above is used to correct position $((Z_k, \theta x_k, \theta y_k)$ computed from measurement values of the k (=2-4)th head group to $Z_k-O_{Zk}, \theta x_k-O_{\theta xk}$, and $\theta y_k-O_{\theta yk}$, respectively. By this correction, height Z and tilt $\theta x$ and $\theta y$ of the k$^{th}$ reference coordinate system Ck (k=2-4) coincides with height Z and tilt $\theta x$ and $\theta y$ of the reference coordinate system $C_1$. In other words, the four reference coordinate systems $C_1$ to $C_4$ are combined into one coordinate system (a combined coordinate system) $C_E$ which covers exposure time movement area $A_0$ to $A_4$.

Main controller 20 also calibrates the four reference coordinates with respect to encoder system 71 according to a similar procedure, and combines the four reference coordinate systems into one coordinate system (a combined coordinate system) $C_A$ which covers alignment time movement area.

Main controller 20 performs the calibration method described above as previously described, each time exposure processing is performed on the wafer (or each time exposure processing is performed on a predetermined number of wafers). In other words, prior to wafer alignment using alignment system ALG, encoder system 70 or (71) on the usage of scale plate 22 is calibrated as previously described (the four reference coordinate systems $C_1$ to $C_4$ are combined into combined coordinate system $C_A$). And, main controller 20 performs wafer alignment on the wafer subject to exposure, using encoder system 70 or (71) which has been calibrated (on combined coordinate system $C_A$). Successively, prior to the exposure processing of a wafer, encoder system 70 (or 71) on the usage of scale plate 22 is calibrated as previously described (the four reference coordinate systems $C_1$ to $C_4$ are combined into combined coordinate system $C_E$). Then, main controller 20 obtains (measures) the positional information of wafer table WTB1 (or WTB2) holding a wafer using encoder system 70 (or 71) (on combined coordinate system $C_E$) which has been calibrated, and based on the measurement results and results of wafer alignment, drives (controls the position of) wafer table WTB1 (or WTB2) when exposing the wafer.

As described in detail above, according to exposure apparatus 100 of the embodiment, within area $A_0$ where of four heads $60_1$ to $60_4$ installed on wafer stages WST1 and WST2, heads included in the first head group and the second head group to which three heads each belong that include one head different from each other face the corresponding areas (sections $21_1$ to $21_4$ and $22_1$ to $22_4$) on scale plates 21 and 22, main controller 20 drives (controls the position of) wafer stages WST1 and WST2 based on positional information which is obtained using the first head group, as well as obtain the displacement (displacement of position, rotation, and scaling) between the first and second reference coordinate systems $C_1$ and $C_2$ corresponding to the first and second head groups using the positional information obtained using the first and second head groups. And by main controller 20 using the results and correcting measurement results obtained using the second head group, the displacement between the first and second reference coordinate systems $C_1$ and $C_2$ is calibrated, which makes it possible to correct the measurement errors that come with the displacement between areas on scale plates 21 and 22 where each of the four heads $60_1$ to $60_4$ face.

Further, according to exposure apparatus 100 of the embodiment, because encoder systems 70 and 71 are calibrated using the calibration method described above and displacement of between the four reference coordinate systems $C_1$ to $C_4$ is corrected, it becomes possible to measure the positional information of wafer stages WST1 and WST2 using encoder systems 70 and 71 and to drive (control the position of) wafer stages WST1 and WST2 with high precision.

Further, according to exposure apparatus 100 of the embodiment, by main controller 20 detecting the three reference marks provided on wafer stages WST1 and WST2 using reticle alignment systems 13A and 13B and alignment system ALG, relative position, relative rotation, and relative scaling of combined coordinate systems $C_E$ and $C_A$ corresponding to exposure time movement area and measurement time movement area, respectively, are obtained. Then, main controller 20 uses the results, which allows results of wafer alignment measured on combined coordinate system $C_A$, such as for example, array coordinates of a plurality of shot areas on the wafer are converted into array coordinates of a plurality of shot areas on the wafer on combined coordinate system CE, and the wafer can be exposed by driving (controlling the position of) wafer stages WST1 and WST2 on combined coordinate system $C_E$ using the results.

Incidentally, in the embodiment above, when wafer stage WST1 located within the zeroth area $A_0$, all the heads $60_1$ to $60_4$ on wafer stage WST1 face scale plate 21 (corresponding sections $21_1$ to $21_4$). Accordingly, within the zeroth area $A_0$, effective measurement values from all of the heads $60_1$ to $60_4$ (encoders $70_1$ to $70_4$) are sent to main controller 20. Accordingly, main controller 20 can drive (control the position of) wafer stages WST1 and WST2 within area $A_0$ where of four heads $60_1$ to $60_4$, heads included in a k$^{th}$ head group (k=1 to 4) previously described to which three heads belong that include one head different from each other face the corresponding area (sections $21_1$ to $21_4$) on scale plate 21, based on positional information which is obtained using at least one head in the k$^{th}$ head group, such as for example, at least one of the first positional information which is obtained using the first head group and the second positional information which is obtained using the second head group. In such a case, even if the coordinate system (section of scale plate 21) corresponding to the first head group and the second head group is different, wafer stages WST1 and WST2 can be driven with high precision without being affected by this. The same is true also in the case of using scale plate 22.

Incidentally, in the embodiment described above, in the calibration process of a displacement of the four reference coordinate systems $C_1$ to $C_4$ which occurs due to a displacement of sections $21_1$ to $21_4$ and $22_1$ to $22_4$ configuring scale plates 21 and 22, not all of position, rotation, and scaling require attention, and one or any two factors may be noted, or other factors (such as the orthogonal degree) may be added or substituted.

Further, at least one auxiliary head can be provided in the vicinity of each of the heads on the four corners of the upper surface of the wafer table, and in the case a measurement abnormality occurs in the main heads, the measurement can be continued by switching to the auxiliary head nearby. In such a case, the placement condition previously described may also be applied to the auxiliary head.

Incidentally, in the embodiment above, while the case where two-dimensional diffraction grating RG was formed on the lower surface of sections $21_1$ to $21_4$ of scale plate 21 and sections $22_1$ to $22_4$ of scale plate 22 was described as an example, besides this, the embodiment described above can also be applied in the case when a one-dimensional diffraction grating whose periodic direction is only in the measurement direction (in a uniaxial direction within the XY plane) of the corresponding encoder heads $60_1$ to $60_4$ is formed.

Incidentally, in the embodiment above, while the case has been described where drive (position control) of wafer stages WST1 and WST2 is performed within area $A_0$ where of the four heads $60_1$ to $60_4$ mounted on wafer stages WST1 and WST2, heads included in a first head group and a second head group to which three heads including one head different from each other belong face the corresponding area on scale plates 21 and 22, based on the positional information which is obtained using the first head group, and measurement errors which accompany the displacement occurring in the area above scale plates 21 and 22 where each of the four heads $60_1$ to $60_4$ faces are corrected, by obtaining the displacement (displacement of position, rotation, and scaling) between the first and second reference coordinate systems $C_1$ and $C_2$ corresponding to the first and second head groups using the positional information obtained using the first and second head groups, and by using the results, correcting the measurement results which can be obtained using the second head group, besides this, for example, the correction information of the positional information of the stage can be obtained by the encoder system, by moving the wafer stage within an area where the position can be measured for each of the plurality (a second number) of heads which is more than the plurality (a first number) of heads used for controlling the position of the wafer stage, or in other words, for example, the stage can move within a cross-shaped area A0 described in the embodiment above, and can obtain the correction information by using a redundancy head.

In this case, while this correction information is used by main controller 20 to correct the encoder measurement value itself, the correction information can be used by other processing. For example, other methods can also be applied, such as driving (performing position control of) the wafer stage while adding an offset to the current position or the target position of the wafer stage with the measurement errors serving as an offset, or correcting the reticle position only by the measurement error.

Further, in the embodiment above, while the case has been described where the displacement (displacement of position, rotation, and scaling) between the first and the second reference coordinate systems $C_1$ and $C_2$ corresponding to the first and second head groups was obtained using the positional information which was obtained using the first and the second head groups, besides this, for example, the exposure apparatus can be equipped with a position measurement system (for example, an encoder system) which obtains the positional information of the wafer stage based on an output of heads which irradiates a measurement beam on a measurement plane which is configured of a plurality of scale plates and is placed roughly parallel to the XY plane outside of the wafer stage in the vicinity of the exposure position of the wafer, of the plurality of heads provided on the wafer stage and a control system which drives the wafer stage based on the positional information obtained by the measurement system, and switches the heads used by the position measurement system to obtain the positional information from the plurality of heads according to the position of the wafer stage, and the control system can obtain the positional relation between the plurality scale plates corresponding to the plurality of heads within a first area within the first area of the movable body where the plurality of heads face the measurement plane. In this case, of the plurality of heads, the plurality of head groups to which a plurality of heads including at least one head different from each other can face the plurality of scale plates, respectively.

In this case, the positional relation between the plurality of scale plates can be used not only to correct the encoder measurement values, but also in other processing as well. For example, other methods can also be applied, such as driving (performing position control of) the wafer stage while adding an offset to the current position or the target position of the wafer stage with the measurement errors serving as an offset, or correcting the reticle position only by the measurement error.

Further, in the embodiment above, as each of the heads $60_1$ to $60_4$ (encoders $70_1$ to $70_4$), while the case has been described where a two-dimensional encoder whose measurement direction is in a uniaxial direction within the XY plane and in the Z-axis direction was employed as an example, besides this, a one-dimensional encoder whose measurement direction is in a uniaxial direction within the XY plane and a one-dimensional encoder (or a surface position sensor and the like of a non-encoder method) whose measurement direction is in the Z-axis direction can also be employed. Or, a two-dimensional encoder whose measurement direction is in two axial directions which are orthogonal to each other in the XY plane can be employed. Or, a two-dimensional encoder whose measurement direction is in two axial directions which are orthogonal to each other in the XY plane can be employed. Furthermore, a three-dimensional encoder (3 DOF sensor) whose measurement direction is in the X-axis, the Y-axis, and the Z-axis direction can also be employed.

Incidentally, in each of the embodiments described above, while the case has been described where the exposure apparatus is a scanning stepper, the present invention is not limited to this, and the embodiment described above can also be applied to a static exposure apparatus such as a stepper. Even in the case of a stepper, by measuring the position of a stage (table) on which the object subject to exposure is mounted using an encoder, position measurement error caused by air fluctuation can substantially be nulled, which is different from when measuring the position of this stage (table) by an interferometer, and it becomes possible to position the stage (table) with high precision based on the measurement values of the encoder, which in turn makes it possible to transfer a reticle pattern on the wafer with high precision. Further, the embodiment described above can also be applied to a projection exposure apparatus by a step-and-stitch method that synthesizes a shot area and a shot area. Moreover, the embodiment described above can also be applied to a multi-stage type exposure apparatus equipped with a plurality of wafer stages, as is disclosed in, for example, U.S. Pat. No. 6,590,634, U.S. Pat. No. 5,969,441, U.S. Pat. No. 6,208,407 and the like. Further, the embodiment described above can also be applied to an exposure apparatus which is equipped with a measurement stage including a measurement member (for example, a reference mark, and/or a sensor and the like) separate from the wafer stage, as disclosed in, for example, U.S. Patent Application Publication No. 2007/0211235, and U.S. Patent Application Publication No. 2007/0127006 and the like.

Further, the exposure apparatus in the embodiment above can be of a liquid immersion type, like the ones disclosed in, for example, PCT International Publication No. 99/49504, U.S. Patent Application Publication No. 2005/0259234 and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of the stage using an encoder.

Further, as is disclosed in, for example, PCT International Publication No. 2001/035168, the embodiment above can also be applied to an exposure apparatus (lithography system) that forms line-and-space patterns on a wafer W by forming interference fringes on wafer W.

Moreover, as disclosed in, for example, U.S. Pat. No. 6,611,316, the embodiment above can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. Further, the embodiment described above can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the disclosures of all publications, the Published PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern formed on a mask is transferred onto an object such as the wafer by the exposure apparatus in the embodiment above, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure apparatus and the exposure method in the embodiment above are used in the lithography step, devices having high integration can be produced with good yield.

Further, the exposure apparatus (the pattern forming apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus which exposes an object with an illumination light via a projection optical system, the apparatus comprising:
    a stage having a holder configured to hold the object;
    a driving system having an electromagnetic motor, which drives the stage by the electromagnetic motor, a part of the electromagnetic motor being provided at the stage;
    an encoder system having a plurality of heads provided at the stage, which measures positional information of the stage by irradiating a measurement beam from below via each of the plurality of heads onto a measurement plane arranged substantially parallel to a predetermined plane perpendicular to an optical axis of the projection optical system; and
    a controller coupled with the driving system and the encoder system, which controls a drive of the stage based on the measured positional information, wherein
    the measurement plane is defined by a plurality of scale plates which are arranged around an exposure position where exposure of the object is performed via the projection optical system and on each of which a reflective grating is formed,
    in a part including the exposure position, of a first movement area where the stage is moved in an exposure operation of the object, the encoder system is capable of measuring the positional information of the stage by the plurality of heads that respectively face the plurality of scale plates, and in another part of the first movement area, the encoder system is capable of measuring the positional information of the stage by remaining heads after excluding one head of the plurality of heads, and
    the controller decides calibration information of the encoder system based on the positional information of the stage measured by the encoder system in the part including the exposure position of the first movement area.

2. The exposure apparatus according to claim 1, wherein in the part including the exposure position of the first movement area, the positional information of the stage can be measured by four heads of the encoder system, and in the another part of the first movement area, the positional information of the stage can be measured by three heads of the four heads.

3. The exposure apparatus according to claim 2, wherein in the another part of the first movement area, a combination of three heads used in the measurement, of the four heads, differs depending on a position of the stage.

4. The exposure apparatus according to claim 1, wherein in the part including the exposure position of the first movement area, the positional information measured by three heads of four heads of the encoder system is used in drive control of the stage, and
    in the another part of the first movement area, the positional information measured by three heads, of the four heads, having one head different from the three heads used in the part including the exposure position is used in the drive control of the stage.

5. The exposure apparatus according to claim 4, wherein prior to a movement of the stage from the part including the exposure position to the another part in the first movement area, one head of the three heads used in the drive control of the stage is switched to another head that is different from the three heads of the four heads, and
    after the switching, the positional information measured by three heads that are two heads different from the one head among the three heads before the switching and the another head is used in the drive control of the stage.

6. The exposure apparatus according to claim 5, wherein the calibration information is used for the drive control of the stage after the switching.

7. The exposure apparatus according to claim 5, wherein the plurality of scale plates each have a two-dimensional grating formed, and are provided at a metrology frame that holds the projection optical system, and
    the plurality of heads are each capable of measuring the positional information of the stage in both of a direction parallel to the predetermined plane and a direction orthogonal to the predetermined plane.

8. The exposure apparatus according to claim 5, further comprising:
    a detection system having a detection position in a second movement area different from the first movement area, which detects positional information of the object, wherein
    the encoder system measures the positional information of the stage that is moved in the second movement area in a detection operation of the object by the detection system, by irradiating the measurement beam from below via each of the plurality of heads onto another measurement plane that is different from the measurement plane and arranged substantially parallel to the predetermined plane, and
    the another measurement plane is defined by different plurality of scale plates that are different from the plurality of scale plates and arranged around the detection position.

9. The exposure apparatus according to claim 8, wherein a part of the measurement plane is an opening, the part including the exposure position, and
    a distance between two heads set apart in a first direction within the predetermined plane, of the plurality of heads, is larger than a width of the opening in the first direction.

10. The exposure apparatus according to claim 9, wherein
the stage is moved so that a plurality of divided areas on the object are each exposed in the first movement area, and
the distance between the two heads in the first direction is larger than a sum of the width of the opening and a width of one of the plurality of divided areas in the first direction.

11. The exposure apparatus according to claim 10, wherein
a distance between two heads set apart in a second direction orthogonal to the first direction within the predetermined plane, of the plurality of heads, is larger than a width of the opening in the second direction.

12. The exposure apparatus according to claim 11, wherein
the stage is moved so that the plurality of divided areas on the object are each exposed in the first movement area, and
the distance between the two heads in the second direction is larger than a sum of the width of the opening and a width of one of the plurality of divided areas in the second direction.

13. The exposure apparatus according to claim 12, wherein
the stage is moved so that scanning exposure of each of the plurality of divided areas on the object is performed in the first movement area, and in an exposure operation of the object, a movement of the stage in the first direction for the scanning exposure and a step movement of the stage in the second direction are performed, and
the distance between the two heads in the first direction is larger than a sum of the width of the opening and twice a distance of the step movement in the first direction.

14. The exposure apparatus according to claim 8, wherein
the stage is moved so that scanning exposure of each of a plurality of divided areas on the object is performed in the first movement area, and
in the another part of the first movement area, a combination of the remaining heads used in measurement of the positional information of the stage, of the plurality of heads, differs depending on a position of the stage, and the combination of the remaining heads is changed at a time other than a scanning exposure period of the divided area.

15. The exposure apparatus according to claim 14, wherein
the combination of the remaining heads is changed before the scanning exposure of the divided area is started or after the scanning exposure of the divided area is completed.

16. The exposure apparatus according to claim 14, wherein
in an exposure operation of the object, a movement of the stage in the first direction for the scanning exposure and a step movement of the stage in a second direction orthogonal to the first direction within the predetermined plane are performed, and
the combination of the remaining heads is changed during the step movement.

17. The exposure apparatus according to claim 8, wherein
the controller controls the drive of the stage while compensating a measurement error of the plurality of heads that occurs due to acceleration of the stage.

18. The exposure apparatus according to claim 8, wherein
in the another part of the first movement area, a combination of the remaining heads used in measurement of the positional information of the stage, of the plurality of heads, differs depending on a position of the stage, and by a change of the combination of the remaining heads according to a movement of the stage, the positional information of the stage is measured using the excluded one head, instead of one of the remaining heads.

19. The exposure apparatus according to claim 18, wherein
prior to starting measurement of the positional information of the stage by the excluded one head, the controller decides a measurement value of the excluded one head based on the positional information of the stage measured by the remaining heads before the change of the combination.

20. The exposure apparatus according to claim 19, wherein
the combination of the remaining heads is changed before the stage is moved from the part including the exposure position to the another part in the first movement area.

21. A device manufacturing method, comprising:
exposing an object using the exposure apparatus according to claim 1; and
developing the exposed object.

22. An exposure method of exposing an object with an illumination light via a projection optical system, the method comprising:
moving a stage that holds the object in a first movement area, for an exposure operation of the object;
measuring positional information of the stage by an encoder system that irradiates a measurement beam from below via each of a plurality of heads provided at the stage onto a measurement plane arranged substantially parallel to a predetermined plane perpendicular to an optical axis of the projection optical system;
controlling a drive of the stage based on the positional information measured by the encoder system; and
deciding calibration information of the encoder system based on the positional information of the stage measured by the encoder system in a part including an exposure position of the first movement area, in the exposure position exposure of the object being performed via the projection optical system, wherein
the measurement plane is defined by a plurality of scale plates which are arranged around the exposure position and on each of which a reflective grating is formed, and
in the part including the exposure position of the first movement area, the positional information of the stage is measured by the plurality of heads that respectively face the plurality of scale plates, and in another part of the first movement area, the positional information of the stage is measured by remaining heads after excluding one head of the plurality of heads.

23. The exposure method according to claim 22, wherein
in the part including the exposure position of the first movement area, the positional information of the stage can be measured by four heads of the encoder system, and in the another part of the first movement area, the positional information of the stage can be measured by three heads of the four heads.

24. The exposure method according to claim 23, wherein
in the another part of the first movement area, a combination of three heads used in the measurement, of the four heads, differs depending on a position of the stage.

25. The exposure method according to claim 22, wherein
in the part including the exposure position of the first movement area, the positional information measured by three heads of four heads of the encoder system is used in drive control of the stage, and
in the another part of the first movement area, the positional information measured by three heads, of the four heads, having one head different from the three heads used in the part including the exposure position is used in the drive control of the stage.

26. The exposure method according to claim 25, wherein
prior to a movement of the stage from the part including the exposure position to the another part in the first movement area, one head of the three heads used in the drive control of the stage is switched to another head that is different from the three heads of the four heads, and
after the switching, the positional information measured by three heads that are two heads different from the one head among the three heads before the switching and the another head is used in the drive control of the stage.

27. The exposure method according to claim 26, wherein the calibration information is used for the drive control of the stage after the switching.

28. The exposure method according to claim 26, wherein
the plurality of scale plates each have a two-dimensional grating formed, and are provided at a metrology frame that holds the projection optical system, and
the plurality of heads each measure the positional information of the stage in both of a direction parallel to the predetermined plane and a direction orthogonal to the predetermined plane.

29. The exposure method according to claim 26, wherein
positional information of the object is detected by a detection system having a detection position in a second movement area different from the first movement area, and the positional information of the stage that is moved in the second movement area in a detection operation of the object by the detection system is measured by the encoder system that irradiates the measurement beam from below via each of the plurality of heads onto another measurement plane that is different from the measurement plane and arranged substantially parallel to the predetermined plane, and
the another measurement plane is defined by different plurality of scale plates that are different from the plurality of scale plates and arranged around the detection position.

30. The exposure method according to claim 29, wherein
a part of the measurement plane is an opening, the part including the exposure position, and
a distance between two heads set apart in a first direction within the predetermined plane, of the plurality of heads, is larger than a width of the opening in the first direction.

31. The exposure method according to claim 30, wherein
the stage is moved so that a plurality of divided areas on the object are each exposed in the first movement area, and
the distance between the two heads in the first direction is larger than a sum of the width of the opening and a width of one of the plurality of divided areas in the first direction.

32. The exposure method according to claim 31, wherein
a distance between two heads set apart in a second direction orthogonal to the first direction within the predetermined plane, of the plurality of heads, is larger than a width of the opening in the second direction.

33. The exposure method according to claim 32, wherein
the stage is moved so that the plurality of divided areas on the object are each exposed in the first movement area, and
the distance between the two heads in the second direction is larger than a sum of the width of the opening and a width of one of the plurality of divided areas in the second direction.

34. The exposure method according to claim 33, wherein
the stage is moved so that scanning exposure of each of the plurality of divided areas on the object is performed in the first movement area, and in an exposure operation of the object, a movement of the stage in the first direction for the scanning exposure and a step movement of the stage in the second direction are performed, and
the distance between the two heads in the first direction is larger than a sum of the width of the opening and twice a distance of the step movement in the first direction.

35. The exposure method according to claim 29, wherein
the stage is moved so that scanning exposure of each of a plurality of divided areas on the object is performed in the first movement area, and
in the another part of the first movement area, a combination of the remaining heads used in measurement of the positional information of the stage, of the plurality of heads, differs depending on a position of the stage, and the combination of the remaining heads is changed at a time other than a scanning exposure period of the divided area.

36. The exposure method according to claim 35, wherein
the combination of the remaining heads is changed before the scanning exposure of the divided area is started or after the scanning exposure of the divided area is completed.

37. The exposure method according to claim 35, wherein
in an exposure operation of the object, a movement of the stage in the first direction for the scanning exposure and a step movement of the stage in a second direction orthogonal to the first direction within the predetermined plane are performed, and
the combination of the remaining heads is changed during the step movement.

38. The exposure method according to claim 29, wherein
the drive of the stage is controlled while a measurement error of the plurality of heads that occurs due to acceleration of the stage is compensated.

39. The exposure method according to claim 29, wherein
in the another part of the first movement area, a combination of the remaining heads used in measurement of the positional information of the stage, of the plurality of heads, differs depending on a position of the stage, and by a change of the combination of the remaining heads according to a movement of the stage, the positional information of the stage is measured using the excluded one head, instead of one of the remaining heads.

40. The exposure method according to claim 39, wherein
prior to starting measurement of the positional information of the stage by the excluded one head, a measurement value of the excluded one head is decided based on the positional information of the stage measured by the remaining heads before the change of the combination.

41. The exposure method according to claim 40, wherein the combination of the remaining heads is changed before the stage is moved from the part including the exposure position to the another part in the first movement area.

42. A device manufacturing method, comprising:
exposing an object using the exposure method according to claim 22; and
developing the exposed object.

43. A method of making an exposure apparatus which exposes an object with an illumination light via a projection optical system, the method comprising:
providing a stage having a holder configured to hold the object;
providing a driving system having an electromagnetic motor, which drives the stage by the electromagnetic motor, a part of the electromagnetic motor being provided at the stage;
providing an encoder system having a plurality of heads provided at the stage, which measures positional information of the stage by irradiating a measurement beam from below via each of the plurality of heads onto a measurement plane arranged substantially parallel to a predetermined plane perpendicular to an optical axis of the projection optical system; and
providing a controller coupled with the driving system and the encoder system, which controls a drive of the stage based on the measured positional information, wherein
the measurement plane is defined by a plurality of scale plates which are arranged around an exposure position where exposure of the object is performed via the projection optical system and on each of which a reflective grating is formed,
in a part including the exposure position, of a first movement area where the stage is moved in an exposure operation of the object, the encoder system is capable of measuring the positional information of the stage by the plurality of heads that respectively face the plurality of scale plates, and in another part of the first movement area, the encoder system is capable of measuring the positional information of the stage by remaining heads after excluding one head of the plurality of heads, and
the controller decides calibration information of the encoder system based on the positional information of the stage measured by the encoder system in the part including the exposure position of the first movement area.

* * * * *

UNITED STATES PATENT AND TRADEMARK OFFICE
CERTIFICATE OF CORRECTION

PATENT NO.       : 9,477,155 B2                                  Page 1 of 1
APPLICATION NO.  : 14/462668
DATED            : October 25, 2016
INVENTOR(S)      : Yuichi Shibazaki It is certified that error appears in the above-identified patent and that said Letters Patent is hereby corrected as shown below:

The following U.S. Patents should be listed on page 2 of the title pages under item (56), U.S. PATENT DOCUMENTS:
8,514,395 B2     8/2013 Shibazaki
8,842,278 B2     9/2014 Shibazaki Signed and Sealed this
Twenty-seventh Day of December, 2016

Michelle K. Lee
*Director of the United States Patent and Trademark Office*